United States Patent
Dröge et al.

(10) Patent No.: US 10,659,073 B2
(45) Date of Patent: May 19, 2020

(54) SEMICONDUCTOR INTEGRATED CIRCUITRY

(71) Applicant: SOCIONEXT INC., Yokohama-shi, Kanagawa (JP)

(72) Inventors: Guido Dröge, Braunschweig (DE); Niklas Linkewitsch, Braunschweig (DE); Charles Joseph Dedic, London (GB); Ian Juso Dedic, Middlesex (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/243,992

(22) Filed: Jan. 9, 2019

(65) Prior Publication Data

US 2019/0229745 A1 Jul. 25, 2019

(30) Foreign Application Priority Data

Jan. 19, 2018 (EP) .................................... 18152581

(51) Int. Cl.
| | |
|---|---|
| *H03M 1/12* | (2006.01) |
| *H03M 1/08* | (2006.01) |
| *G05F 3/24* | (2006.01) |
| *H03M 1/38* | (2006.01) |

(52) U.S. Cl.
CPC ............ *H03M 1/1245* (2013.01); *G05F 3/24* (2013.01); *H03M 1/0845* (2013.01); *H03M 1/38* (2013.01); *H03M 1/1215* (2013.01)

(58) Field of Classification Search
CPC .... H03M 1/1245; H03M 1/123; H03M 1/002; H03M 1/004; H03M 1/1215; H03M 1/182; H03M 1/361; H03M 1/367; H03M 1/56; H03M 3/30; H03M 3/424; H03M 3/476;

(Continued)

(56) References Cited

U.S. PATENT DOCUMENTS

| | | | | |
|---|---|---|---|---|
| 5,506,541 | A | * 4/1996 | Herndon | .................... G05F 3/24 326/110 |
| 7,479,916 | B1 | * 1/2009 | Reshef | .................. H03M 1/123 341/169 |
| 9,111,602 | B2 | 8/2015 | Smeloy | |

(Continued)

OTHER PUBLICATIONS

Partial European Search Report issued in corresponding European Patent Application No. 18152581.7 dated Jul. 27, 2018.

(Continued)

*Primary Examiner* — Linh V Nguyen
(74) *Attorney, Agent, or Firm* — Arent Fox LLP

(57) ABSTRACT

The present invention relates to semiconductor integrated circuitry, and in particular to such circuitry where one or a plurality of similar or identical operating units are each operable to carry out an operation dependent on a reference signal. One example of such an operating unit is a sub-ADC unit of analogue-to-digital converter (ADC) circuitry, which employs one or more such sub-ADC units to convert samples of an input analogue signal into representation digital values. Where there are a plurality of sub-ADC units, they may each convert samples of an input analogue signal into representative digital values. They may also operate in a time-interleaved manner so that their conversion rate (from sample to digital value) can be lower than the overall sample rate by a factor of the number of sub-ADC units.

16 Claims, 9 Drawing Sheets

(58) Field of Classification Search
CPC .... H03M 1/0624; H03M 1/0845; H03M 1/38; H03M 1/46; H03M 1/462
USPC .......................... 341/118, 120, 141, 142, 144
See application file for complete search history.

(56) References Cited

U.S. PATENT DOCUMENTS

| | | |
|---|---|---|
| 9,112,521 B2 | 8/2015 | Dedic et al. |
| 2004/0047184 A1* | 3/2004 | Tran .................. G11C 7/065 365/185.21 |
| 2008/0279017 A1* | 11/2008 | Shimano ............ G11C 5/063 365/189.06 |
| 2010/0188140 A1* | 7/2010 | Smeloy ............... G11C 5/147 327/538 |
| 2013/0028014 A1* | 1/2013 | Guo .................. G11C 7/062 365/163 |
| 2017/0264305 A1* | 9/2017 | Stanton ................. H03K 5/24 |
| 2017/0264308 A1 | 9/2017 | Danson et al. |

OTHER PUBLICATIONS

Ku, I, et al., "A 40-mW 7-bit 2.2-GS/s Time-Interleaved Subranging CMOS ADC for Low-Power Gigabit Wireless Communications", IEEE Journal of Solid-State Circuits, vol. 47, No. 8, pp. 1854-1865, Aug. 1, 2012.

Bulzacchelli, J. et. al, "Dual-Loop System of Distributed Microregulators With High DC Accuracy, Load Response Time Below 500 ps, and 85-mV Dropout Voltage", IEEE Journal of Solid-State Circuits, vol. 47, No. 4, pp. 863-874, Apr. 1, 2012.

Lai, S., et al., "Stability Assurance and Design Optimization of Large Power Delivery Networks with Multiple On-chip Voltage Regulators", Computer-Aided Design, pp. 247-254, Nov. 5, 2012.

\* cited by examiner

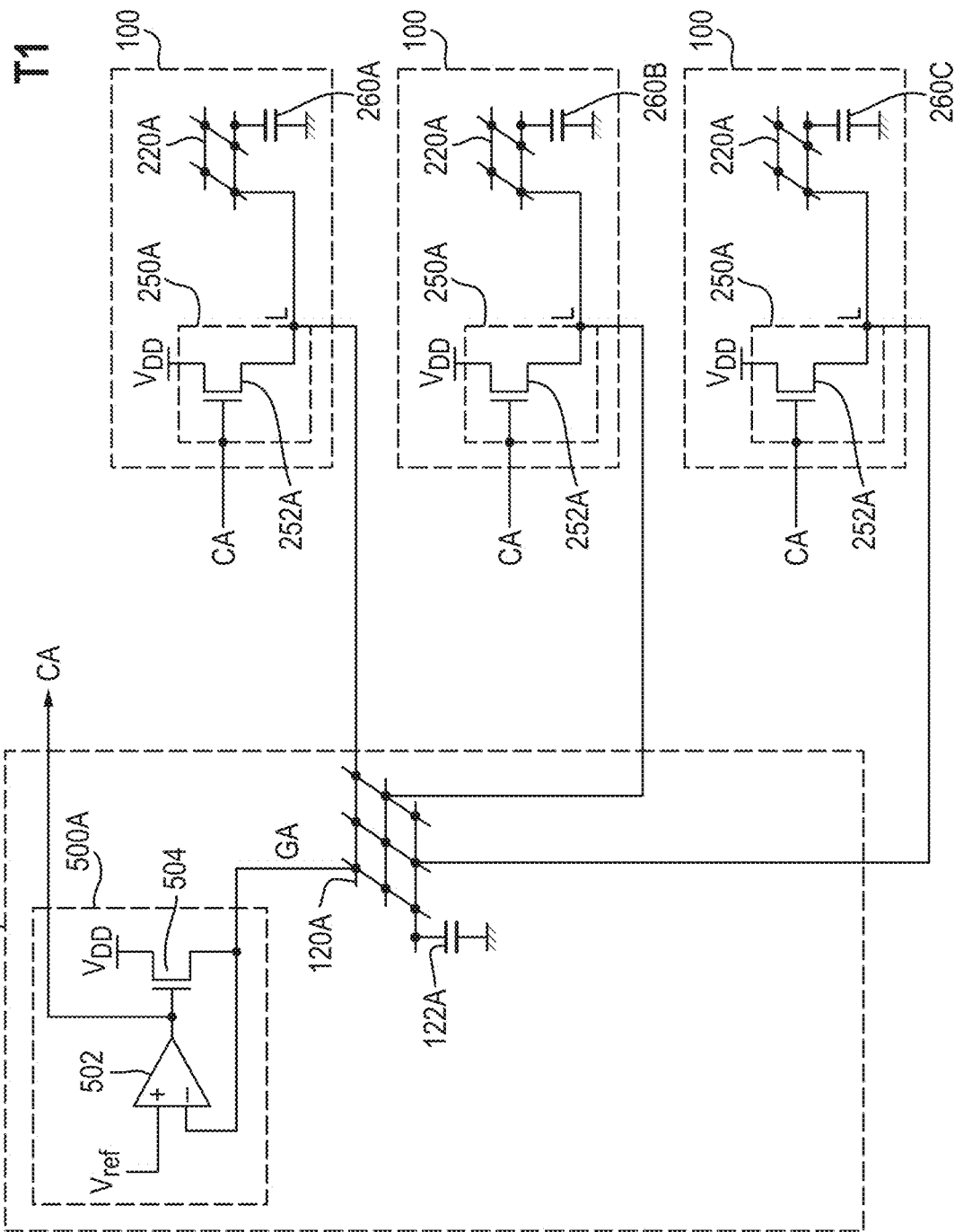

SEMICONDUCTOR INTEGRATED CIRCUITRY

CROSS-REFERENCE TO RELATED APPLICATION

This application claims priority from European patent Application No. 18152581.7 filed Jan. 19, 2018. The entire contents of the prior application are incorporated herein by reference.

The present invention relates to semiconductor integrated circuitry, and in particular to such circuitry where one or a plurality of similar or identical operating units are each operable to carry out an operation dependent on a reference signal.

One example of such an operating unit is a sub ADC unit of analogue-to-digital converter (ADC) circuitry, which employs one or more such sub-ADC units to convert samples of an input analogue signal into representative digital values. Where there are a plurality of sub-ADC units, they may each convert samples of an input analogue signal into representative digital values. They may also operate in a time-interleaved manner so that their conversion rate (from sample to digital value) can be lower than the overall sample rate by a factor of the number of sub-ADC units.

Of course, other types of operating unit also carry out operations dependent on a reference signal, however for convenience the example of sub-ADC units of ADC circuitry will be taken forward as a running example.

It will be appreciated that sub-ADC units, each being an ADC in itself, typically require a reference signal—such as a voltage or current—against which the analogue input value is compared in order to generate a representative digital value. For example, in the case of SAR (Successive Approximation Register) ADCs, each conversion from an analogue sample to a representative digital value comprises a series of sub-conversion operations. In each sub-conversion operation the sample is processed together with the reference signal (using all or a fractional portion of the reference value represented by the reference signal), effectively to assess the magnitude of the sample compared to the reference signal, to ultimately arrive at a multibit digital value.

The quality of this reference signal directly influences converter performance, and therefore noise on the reference signal can detrimentally affect the ADC digital output values and thus the overall ADC performance.

It is desirable to improve the performance of such circuitry.

According to an embodiment of a first aspect of the present invention, there is provided semiconductor integrated circuitry, comprising: a plurality of operating units each comprising a local regulation circuit, a local reference node and operating circuitry, and each operating unit being operable to carry out an operation dependent on a reference signal provided at its local reference node; and reference regulation circuitry which comprises the local regulation circuits and is connected to provide respective reference signals at the local reference nodes, wherein, for each of the operating units; the local regulation circuit has an input terminal connected to receive a control signal from the reference regulation circuit and is configured to regulate a reference signal at the local reference node based on the received control signal; the input terminal of the local regulation circuit has a high input impedance so that a relatively low amount of current is drawn from the reference regulation circuitry by the input terminal; and the local regulation circuit is configured to draw a relatively high amount of current from a voltage supply and provide that current to the operating circuitry concerned at the local reference node.

In this way, at least some of the current drawn over reference signals by the operating circuitry of the operating units does not need to be directed along wide distances. This leads to lower IR drops in general, and better matching in IR drops between operating units, and thus better noise performance. Drawing current locally from supply (in each operating unit) is advantageous as compared to drawing it on a reference signal. Here the voltage supply (e.g. supply source) provides the supply voltage, which is of course different from a reference source providing a reference voltage.

Each local reference node could be considered a local reference grid. Similarly, each global reference node could be considered a global reference grid. A high input impedance would be understood in the context of semiconductor integrated circuitry as equating for example to the input impedance of the gate terminal of a MOSFET. A very low or substantially no current is drawn by the input terminal.

According to an embodiment of a second aspect of the present invention, there is provided semiconductor integrated circuitry, comprising: an operating unit comprising operating circuitry, switching circuitry and first to Nth local reference nodes, where N is an integer and N≥2, the operating circuitry being operable to carry out series of first to Nth operations each dependent on a corresponding reference signal, each of the N operations having a corresponding noise tolerance level of first to Nth noise tolerance levels, those N noise tolerance levels being different from one another; reference regulation circuitry connected to provide first to Nth respective separate reference signals at the N local reference nodes; and control circuitry, wherein: X is an integer variable ranging from 1 to N; the control circuitry is configured, for the operating unit, to control its switching circuitry as the N operations are carried out to selectively connect its operating circuitry to its local reference nodes so that its operating circuitry employs the Xth reference signal provided at its Xth local reference node as the reference signal for its Xth operation; and each noise tolerance level is a level of noise in the employed reference signal which the operation concerned can tolerate.

In this way, it is possible to use different reference signals for different operations which have different noise tolerance levels, and thus to arrange the different reference signals so that they suit the different operations (in terms of the level of noise in the employed reference signal which the operation concerned can tolerate). It may also be possible to arrange the different reference signals so that they suit the different operations in terms of the level of noise which the operation concerned injects into the employed reference signal. A plurality of such operating units may share the reference signals and operate in a time-interleaved manner.

Each local reference node could be considered a local reference grid. N may be 2 or 3 or 4 or any higher integer number. The operations may be carried out in a given order, e.g. from 1 to N.

According to an embodiment of a third aspect of the present invention, there is provided semiconductor integrated circuitry, comprising: an operating unit comprising operating circuitry, switching circuitry and first to Nth local reference nodes, where N is an integer and N≥2, the operating circuitry being operable to carry out a series of first to Nth operations each dependent on a corresponding reference signal; reference regulation circuitry connected to provide first to Nth respective reference signals at the N local reference nodes; and control circuitry, wherein: X is an integer variable ranging from 1 to N; the control circuitry is configured, for the operating unit, to control its switching circuitry as the N operations are carried out to selectively connect its operating circuitry to its local reference nodes so that its operating circuitry employs the Xth reference signal provided at its Xth local reference node as the reference signal for its Xth operation; and the series of operations comprises carrying out the N operations in an order such that X increases from 1 to N; the switching circuitry comprises first to Nth switches connecting a reference-signal-input node of the operating circuitry to the first to Nth local reference nodes, respectively; for each value of X from 1 to N−1, the control circuitry is configured to turn on the Xth switch to provide the reference-signal-input node of the operating circuitry with the reference signal provided at the Xth local reference node for the Xth operation and then turn off the Xth switch and turn on the X+1th switch to provide the reference-signal-input node of the operating circuitry instead with the reference signal provided at the X+1th local reference node for the X+1 th operation; and the switches are sized relative to one another so as to limit or minimize or reduce to zero a net amount of charge injected into the reference-signal-input node of the operating circuitry from the reference nodes when the Xth switch is turned off and the X+1th switch is turned on, for each value of X from 1 to N−1.

Thus, it is possible to configure the switches so that they are balanced, in that, as they switch from one reference signal to the next, i.e. from one local reference node (or grid) to the next, there is substantially zero net charge injection into the reference-signal-input node of the operating circuitry concerned. This leads to improved noise performance of the operating circuitry employing the reference signals. This may also lead to improved noise performance (lower noise) of the reference signals themselves, and thus of other operating units using/sharing those reference signals or signals related thereto.

Each local reference node could be considered a local reference grid. N may be 2 or 3 or 4 or any higher integer number. The operations may be carried out in a given order, e.g. from 1 to N.

According to an embodiment of a fourth aspect of the present invention, there is provided semiconductor integrated circuitry, comprising: a plurality of operating units each comprising a local reference node and operating circuitry, and each operating unit being operable to carry out an operation dependent on a reference signal provided at its local reference node; a global reference node; and a distribution circuit via which the local reference nodes of each of the operating units are connected to the global reference node, wherein: the distribution circuit is configured to connect the local reference nodes of each of the operating units to the global reference node via respective independent signal paths; and each signal path comprises a filter circuit connected therealong.

The separation between local and global nodes (e.g. grids) with filter circuits leads to improved noise performance of the operating units as the global node to which they are all connected is better insulated from noise on the reference signals at the local reference nodes.

Each local reference node could be considered a local reference grid. Similarly, each global reference node could be considered a global reference grid. Each filter circuit may be described simply as a filter, and may be implemented simply as a resistor.

The present invention extends to method and computer program aspects (e.g. for control) corresponding to the apparatus (circuitry) aspects.

Reference will now be made, by way example only, to the accompanying Figures, of which:

Figure 7:
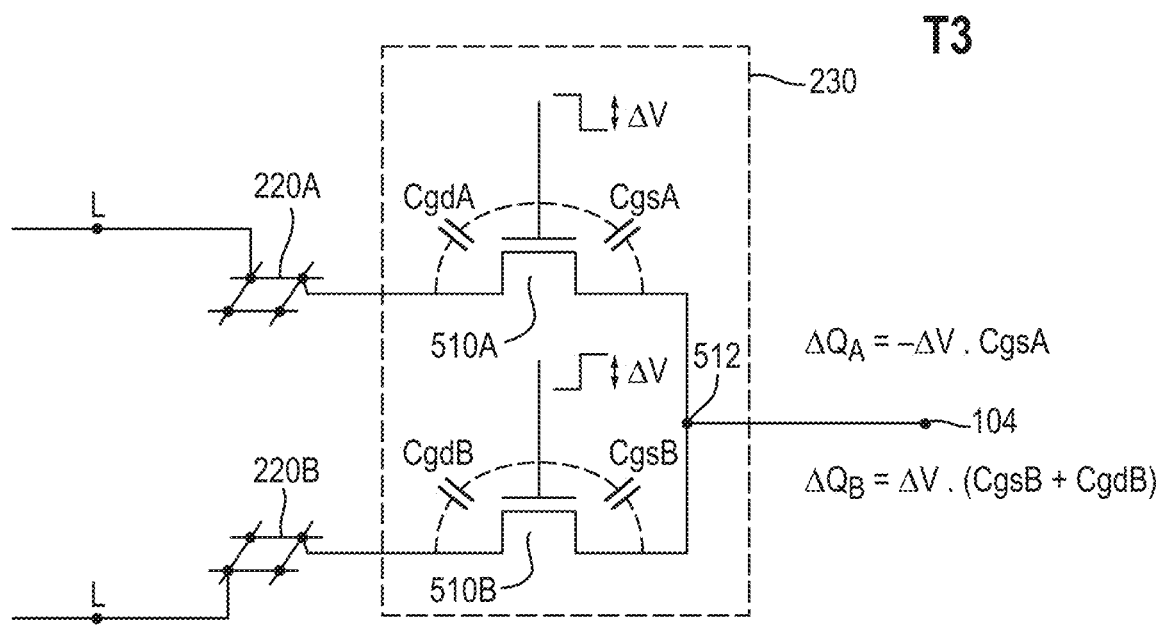
Figure 8A:
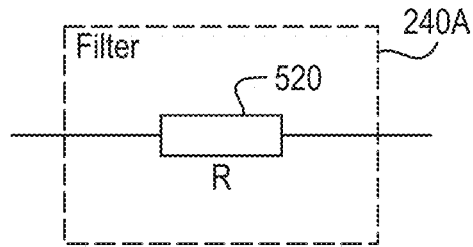
Figure 8B:
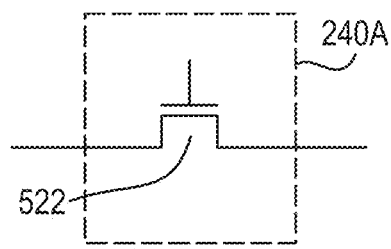
Figure 8C:
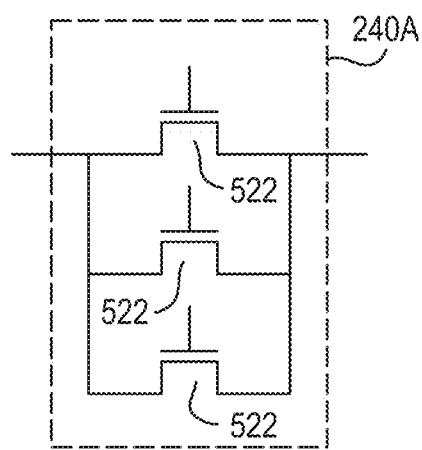
Figure 9:
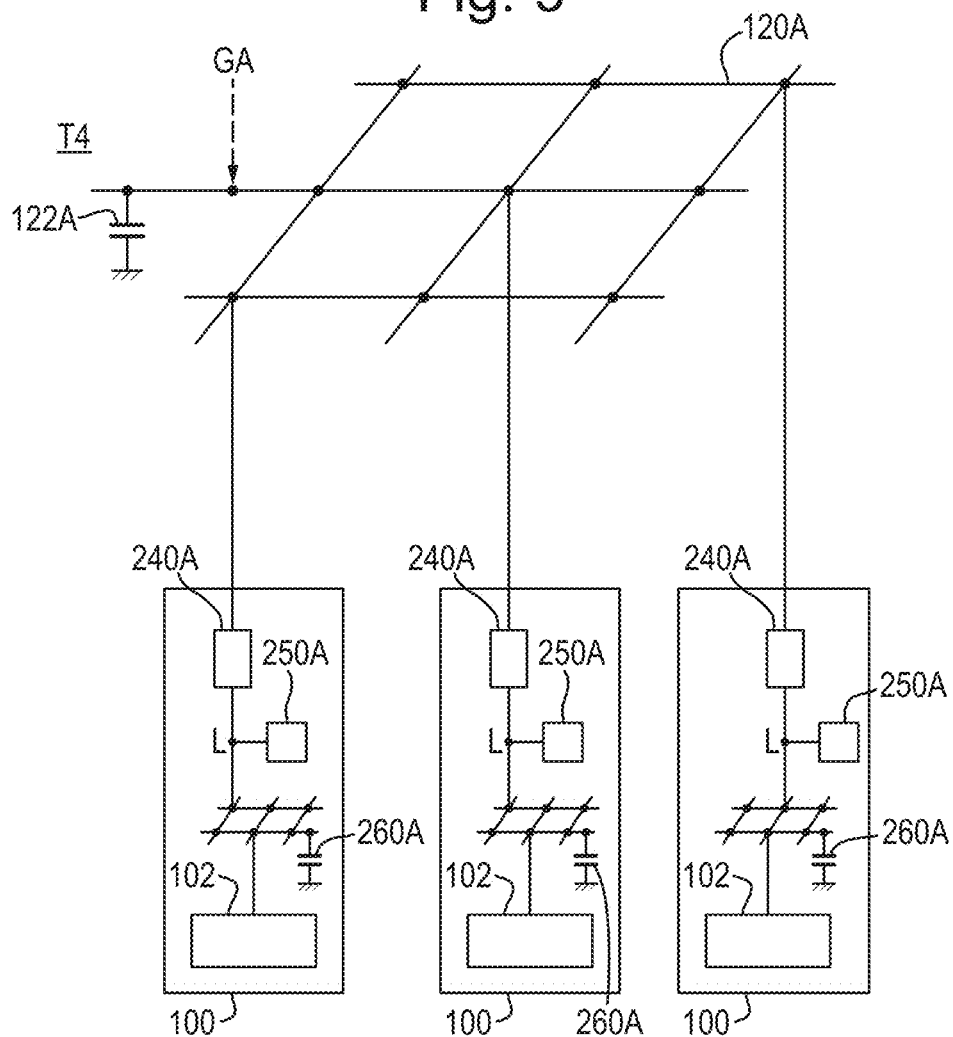
Figure 10:
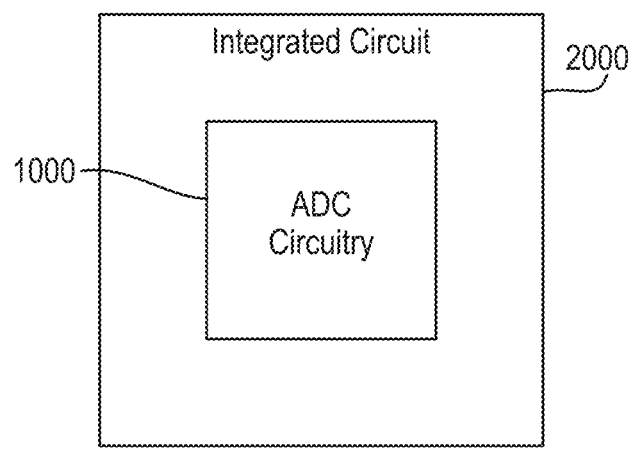

FIG. 5 is a schematic diagram relating to technique T1;
FIG. 6 is a schematic diagram relating to technique T2;
FIG. 7 is a schematic diagram relating to technique T3;
FIG. 8 is a schematic diagram relating to technique T4;
FIG. 9 is a schematic diagram relating to technique T4; and FIG. 10 is a schematic diagram of an integrated circuit embodying the present invention.

Figure 1:
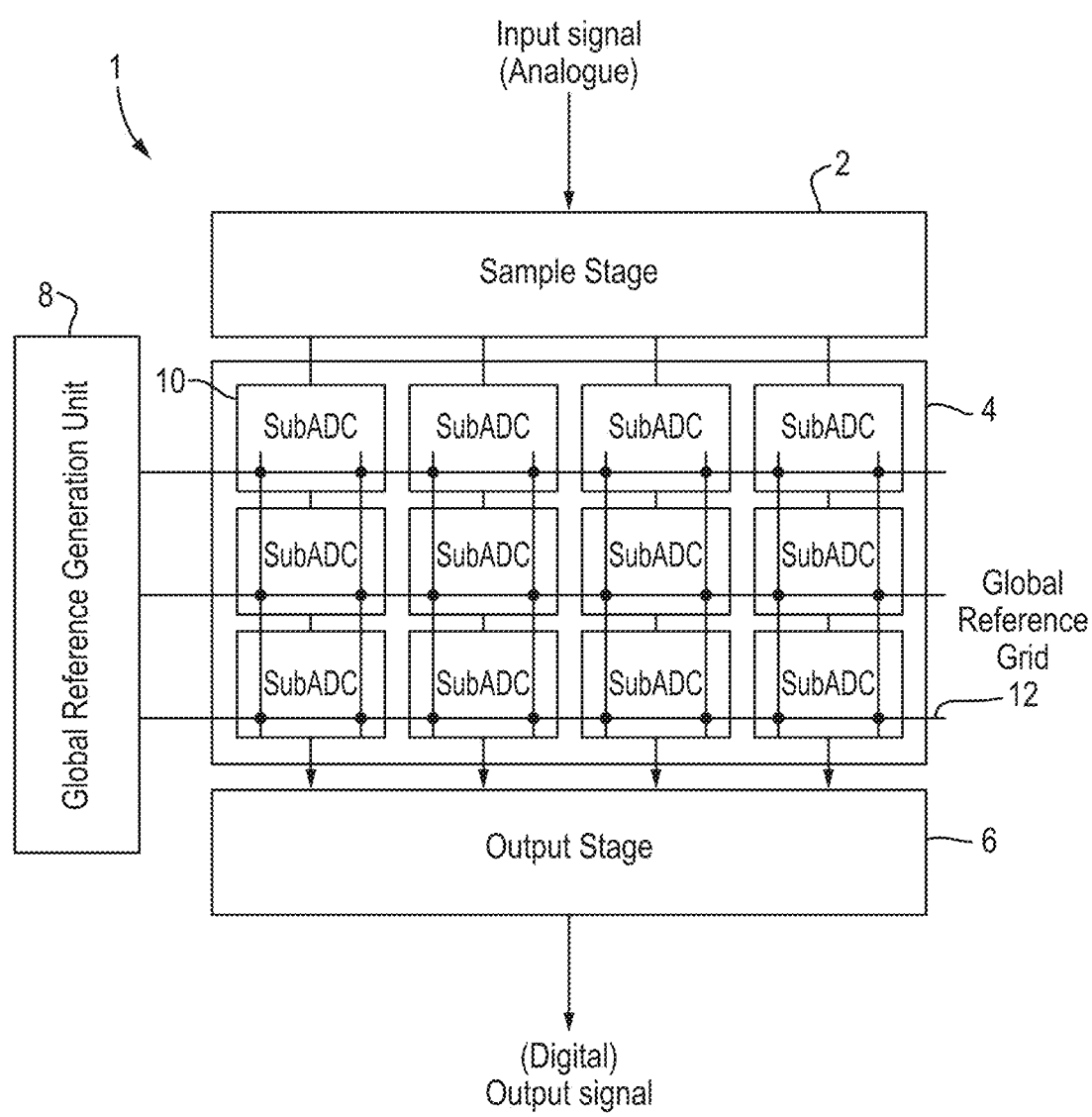
FIG. 1 is a schematic diagram of ADC circuitry useful to give an idea of the context in which embodiments of the invention may be employed.

Continuing the running example of ADC circuitry, FIG. 1 is schematic diagram of ADC circuitry 1 to give an idea of the context in which embodiments of the invention may be employed. The ADC circuitry 1 comprises a sample stage 2, a sub-ADC stage 4, an output stage 6 and a global reference generation (regulation) unit 8.

The sample stage 2 is configured to receive an analogue input signal, and to generate a series of samples from that input signal and supply them to the sub-ADC stage 4. The sub-ADC stage 4 is configured to convert the samples into representative digital values and output those digital values to the output stage 6. The output stage 6 is configured to output a digital output signal based on those digital values.

The sub-ADC stage 4 comprises a plurality of sub-ADC units 10, which together generate the digital values from the samples. As mentioned above, such sub-ADC units 10 each require a reference signal—in this case a voltage reference signal—against which each sample (constituting an analogue input value) is compared in order to generate the corresponding representative digital value. The global reference generation (regulation) unit 8 is configured to create the reference signal and distribute it to the sub-ADC units 10 via a global reference grid 12 as shown.

The sub-ADC units 19 here are SAR sub-ADC units 10, and thus generate each of their digital values based on a series of sub-conversion operations. Further, the sub-ADC units 10 are configured to operate in a time-interleaved manner, so that samples are provided to them one-by-one in a repeating order. In the example shown in FIG. 1 there are 12 sub-ADC units 10 arranged in a grid structure having three rows and four columns, however this is of course schematic and any integer number of sub-ADC units 10 may be provided. The time-interleaving may thus by organised such that samples are provided to the sub-ADC units 10 one-by-one along each row, working through the rows one-by-one, and then returning back the beginning.

The overall analogue-to-digital conversion is thus distributed, with the sub-ADC units 10 effectively operating in parallel, albeit in a time-interleaved manner (as will become clearer in relation to FIG. 3 described below). The sub-ADC units 10 share the same reference signal provided over the global reference grid 12. Of course, the grid structure shown in FIG. 1 is an example, and the sub-ADC units 10 could instead be arranged in a single line with a corresponding global reference line rather than grid. The term grid herein will be considered to encompass such a single line.

As mentioned above, noise on the reference signal can detrimentally affect the ADC digital output values and thus the overall ADC performance. The inventors have considered that a reference signal generated by such a global reference generation (regulation) unit 8 may be kept as "clean" (noise free) as possible through decoupling and compensation circuitry.

However, the inventors have considered the problem of noise on the reference signal further, and have devised a set of techniques which provide improved noise performance.

Figure 2:
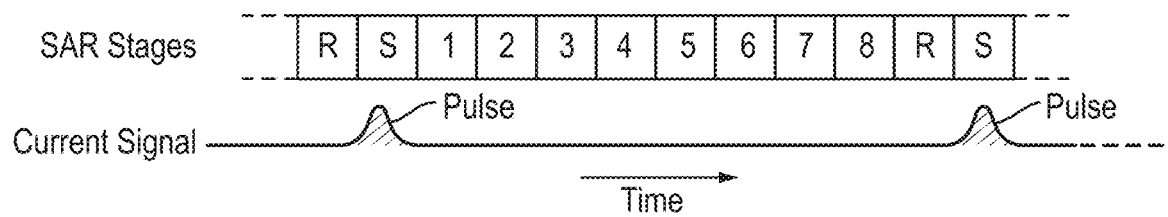
FIG. 2 is a schematic diagram useful for understanding in overview how a SAR sub-ADC unit of FIG. 1 operates.

In order to better appreciate these techniques, FIG. 2 is a schematic diagram useful for understanding in overview how a SAR sub-ADC unit 10 operates. It is assumed that the samples are provided as current pulses, i.e. with the size of the pulse (the amount of charge it holds) constituting the analogue value to be converted into a representative digital value.

As an example, such a sub-ADC unit 10 could have a cycle of sub-conversion operations (phases/steps) of the form: Reset (R); Sample (S); 1; 2; 3; 4; 5; 6; 7 and 8, as shown in FIG. 2. In each Sample sub-conversion operation, a current pulse concerned may be converted into a corresponding voltage (such that the voltage then constituting the analogue value), and subsequently that voltage may be turned into an 8-bit digital value over the following 8 SAR sub-conversion operations. The next Reset sub-conversion operation then prepares the circuitry for the next current pulse.

The sub-conversion operations may implement a binary search, in which a search space (e.g. values 0 to 255) is limited by 2 each time until a final 8-bit value is reached. In such a binary search, the operations will be weighted one to the next by a ratio 2 (e.g. with some of the operations having relative weights 32, 16, 8, 4, 2, 1).

However, the sub-conversion operations may implement a non-binary search, where the operations are weighted one to the next by a ratio which is between 1 and 2 (e.g. with some of the operations having relative weights 29, 16, 9, 5, 3, 2). This to a certain degree permits some errors to be made during the conversion process which can be corrected by digital error correction afterwards. Some of the techniques disclosed herein utilise the additional degree of freedom of non-binary conversion in order to improve overall noise performance.

For example, in non-binary searches there is an overlap in the search space from one sub-conversion operation to the next (e.g. 16 is more than half of 29, 9 is more than half of 16, etc.) with the overlap being larger for the earlier sub-conversion operations (for the MSBs) and smaller for the later sub-conversion operations (for the LSBs). Thus, some sub-conversion operations may be able to tolerate more noise on the reference signal than others. Such sub sub-conversion operations may also inject more noise on the reference signal than others.

A problem with the ADO circuitry 1 of FIG. 1 is that sub-conversion operations of one sub-ADC unit 10 generate noise on the shared global reference grid 12 which impacts the operation of other sub-ADC units 10 in the sub-ADO stage 4. In the case of non-binary conversions the noise a sub-ADC unit 10 injects on its own can be tolerated as this noise is correlated and generally only impacts the settling behaviour of the sub-ADC unit 10. However, the noise injected by other sub-ADO units 10 affects its sub-conversion operations. This reduces the overall ADC resolution. That is, noise on shared reference lines or grids degrades converter performance.

Figure 3:
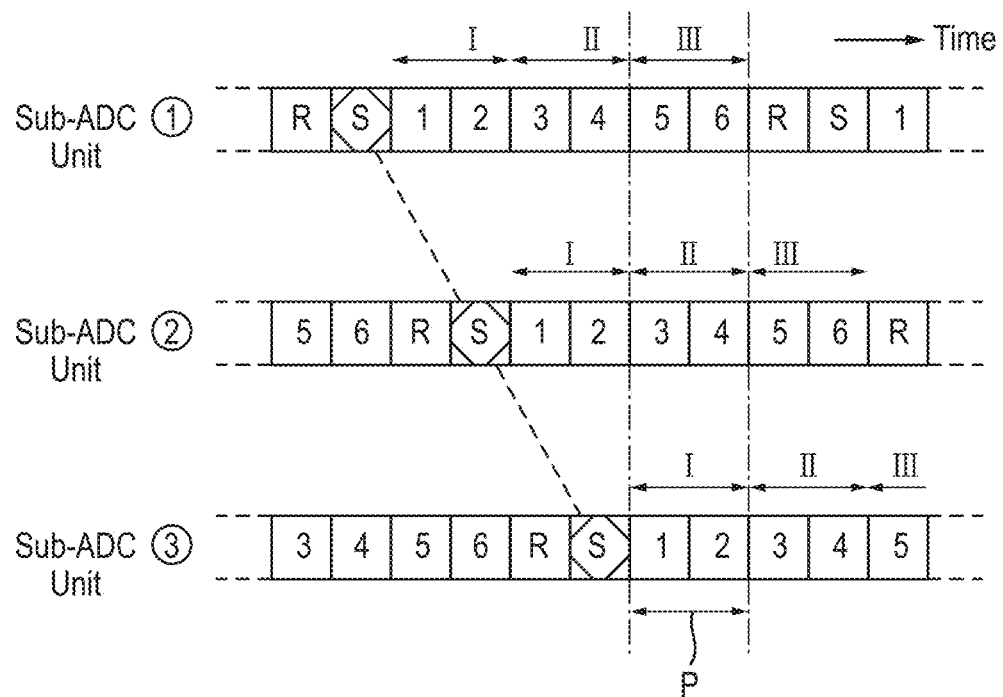
FIG. 3 is a schematic diagram useful for understanding the time-interleaved operation of the FIG. 1 SAR sub-ADC units.

To aid in appreciating this problem further, FIG. 3 is a schematic diagram useful for understanding the time-interleaved operation of the SAID sub-ADO units 10. For convenience, the same conversion scheme as in FIG. 2 is adopted, except that the numbered operations are from 1 to 6 rather than from 1 to 8. The sub-conversion operations phases steps) are shown for an example three sub-ADC units 10 which are operating in a time-interleaved manner. These sub-ADC units 10 are numbered 1 to 3, respectively.

The Sample sub-conversion operation is highlighted for each of the sub-ADC units 10, to emphasise the time-interleaved operation. Thus, the second sub-ADC unit 10 carries out its Sample sub-conversion operation when the first sub-ADC unit 10 carries out its sub-conversion operation 2. The third sub-ADC unit 10 carries out its Sample sub-conversion operation when the second sub-ADC unit 10 carries out its sub-conversion operation 2 and the first sub-ADC unit 10 carries out its sub-conversion operation 4. Thus, different sub-ADC units 10 are at different points in their conversion operations at the same time.

Further, it is indicated that the sub-conversion operations 1 to 6 are divided into three groups, labelled I, III and III, respectively. There are two sub-conversion operations in each group here but there could be any number of sub-conversion operations per group.

Here, the operations of group I have a first noise tolerance level, the operations of group II have a second noise tolerance level, and the operations of group III have a third noise tolerance level. Each noise tolerance level is a level of noise in the employed (shared) reference signal which the operation or operations concerned can tolerate. It is assumed that these noise tolerance levels are different from one another. For example, the first noise tolerance level may be larger than the second noise tolerance level, which may be larger than the third noise tolerance level. Thus, the operations of group I are least sensitive to noise and the operations of group III are most sensitive to noise. This relationship between the noise tolerance levels may be particularly applicable in relation to the non-binary search discussed above.

It is also assumed that the operations of group I have a first noise injection level, the operations of group II have a second noise injection level, and the operations of group III have a third noise injection level. Each noise injection level is a level of noise which the operation concerned injects into the employed (shared) reference signal. It is assumed that these noise injection levels are different from one another. For example, the first noise injection level may be larger than the second noise tolerance level, which may be larger than the third noise injection level. Thus, the operations of group I generate the most noise and the operations of group generate the least noise. This relationship between the noise injection levels may be particularly applicable in relation to e.g. charge-redistribution sub-ADC units, where the level of charging/discharging capacitors is lower in the later sub-conversion operations.

Looking back to FIG. 3, it can be seen that, in the indicated time period P, the third sub-ADC unit 10 carries out its group I sub-conversion operations, the second sub-ADC unit 10 carries out its group II sub-conversion operations and the first sub-ADC unit 10 carries out its group III sub-conversion operations. Thus, while the first sub-ADC unit 10 is most sensitive to noise and generates the least noise, the third sub-ADC unit 10 is least sensitive to noise but generates the most noise. These sub-ADC units 10 therefore detrimentally affect each other's performance, and thus the overall ADC performance, and this is worse as a result of the time-interleaved operation.

Of course, FIG. 3 presents just a simple example to demonstrate that different sub-ADC units 10 may be at different points in their conversion operations at the same time. It is not required that the second sub-ADC unit 10 starts its Sample sub-conversion operation when the first sub-ADC unit 10 carries out its sub-conversion operation 2, for example. It may for example start its Sample sub-conversion operation when the first sub-ADC unit 10 carries out its sub-conversion operation 1, so that there is always one sub-ADC unit in its Sample sub-conversion operation. Further, it is not required that all individual sub-conversion operations are of same duration. Sub-conversion operations can transition one-to-the-next asynchronously, for example.

Moving to the set of techniques themselves, the set may be divided into four general techniques. The first general technique (T1) relates to using distributed but still shared reference sources. The second general technique (T2) relates to using multiple references during analogue-to-digital conversion, i.e. an arbitrary number of separated voltage references with different accuracy levels. The third general technique (T3) relates to using balanced switches for smooth switching between references, i.e. balanced switches for enabling smooth transitions when switching towards the next voltage reference. The fourth general technique (T4) relates to separating references into global and local domains and using filtering between them to maximise noise reduction on the global grid, i.e. separating local references from a global reference grid via a filter stage to help prevent noise transmission between different sub-ADC units.

These techniques are well suited towards non-binary distributed SAR sub-ADC units in line with FIG. 1, as well as utilizing their given degrees of freedom. These techniques enable noise on reference grids to be reduced and ADC resolution to be improved.

In order to introduce these techniques, reference will be made to FIG. 4A. It is however noted at this stage that, although FIG. 4A demonstrates how all four techniques T1 to T4 can be used in combination, any one of them or any combination of two or more of them may be used alone.

Figure 4A:
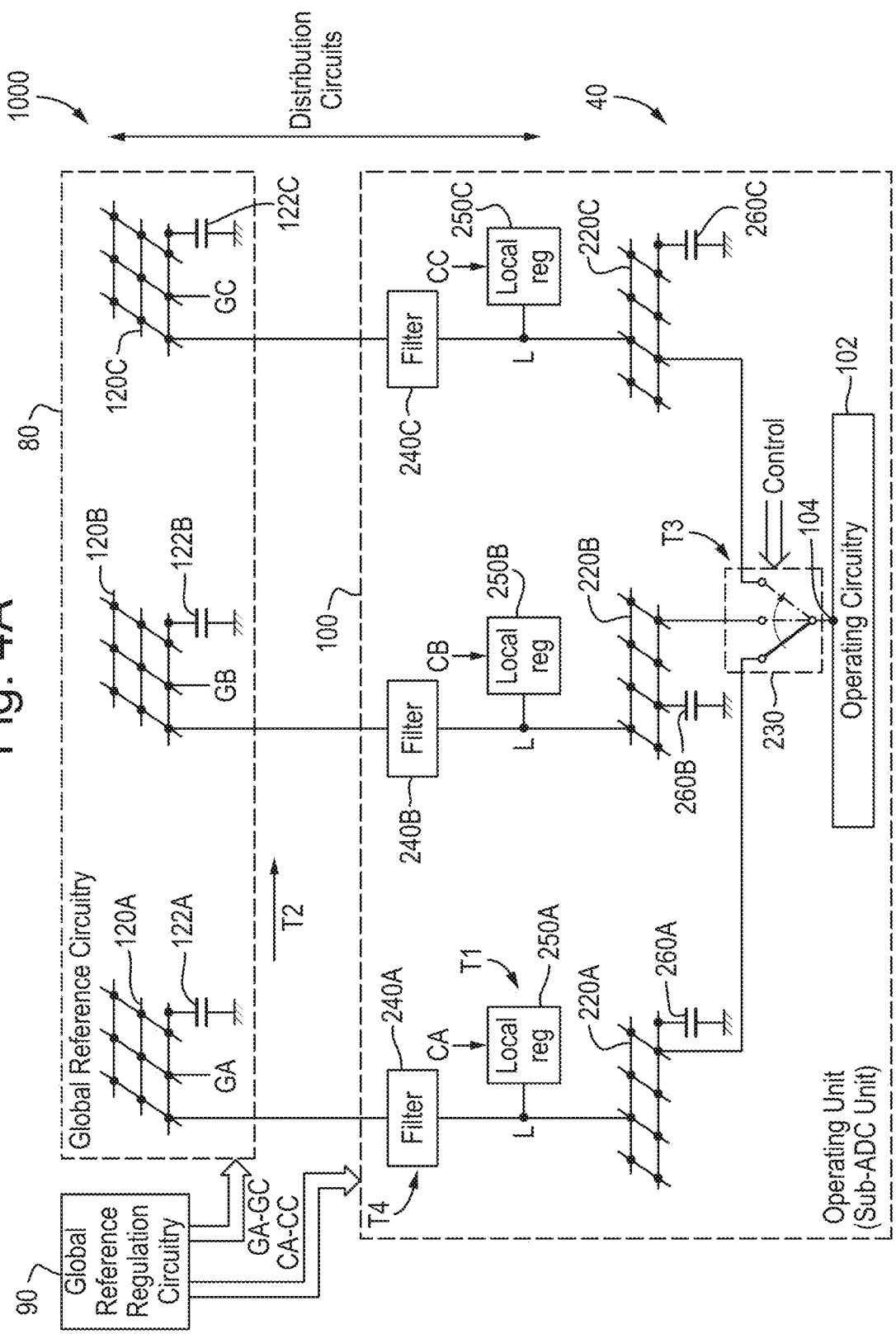
FIG. 4A is a schematic diagram of system (e.g. ADC) circuitry embodying the present invention, in which techniques T1 to T4 are implemented.

FIG. 4A is a schematic diagram of ADC circuitry 1000 embodying the present invention. The ADC circuitry 1000 has the same general arrangement as the ADC circuitry 1, in that the overall analogue-to-digital conversion is distributed, with sub-ADC units effectively operating in parallel, albeit in a time-interleaved manner.

The ADC circuitry 1000 comprises a sample stage 20 (not shown), a sub-ADC stage 40 and an output stage 60 (not shown), corresponding to the sample stage 2, sub-ADC stage 4 and output stage 6, respectively. The ADC circuitry 1000 also comprises global reference circuitry 80 and global reference regulation circuitry 90 together corresponding to the global reference generation unit 8.

For simplicity, the sample stage 20 and output stage 60 are not shown. The sub-ADC stage 40 comprises a plurality of sub-ADC units (operating units) 100, each corresponding to the sub-ADC units 10 of FIG. 1. However, again for simplicity, only one of the sub-ADC units 100 of the sub-ADC stage 40 is shown.

For completeness, although not explicitly shown, the sample stage 20 is configured to receive an analogue input signal, and to generate a series of samples from that input signal and supply them to the sub-ADC stage 40. The sub-ADC stage 40 is configured to convert the samples into representative digital values and output those digital values to the output stage 60. The output 55 is configured to output a digital output signal based on those digital values.

The sub-ADC units 100 each require a reference signal—in this case a voltage reference signal (another example could be a current reference signal)—against which each sample (constituting an analogue input value) is compared in order to generate the corresponding representative digital value. The global reference circuitry 80 and global reference regulation circuitry 90 are broadly configured to create such a reference signal and distribute it to the sub-ADC units 100, however exactly how this is achieved is dependent on which of the techniques T1 to T4 is or are employed.

Although the example of ADC circuitry is being carried forward as mentioned above, it is noted that the sub-ADC units 100 may be considered a specific example of operating units each comprising a local reference node L and operating circuitry, each operating unit being operable to carry out an operation dependent on a reference signal provided at its local reference node L. Thus the ADC circuitry 1000 may more generally be referred to as system circuitry 1000. This terminology will be carried forwards however the example of ADC circuitry will be considered to apply and will be referred to when appropriate. Further, although one operating unit (sub-ADC unit) 100 is focused on in FIG. 4A, the other operating units (sub-ADC units) 100 may be arranged in the same way.

Thus, before the techniques T1 to T4 are explained further, FIG. 4A will be considered in more detail. At this juncture, it is important to note that not all elements shown are required for each of techniques T1 to T4. This will become more apparent later herein.

The operating unit 100 comprises operating circuitry 102 as mentioned above, being operable to carry out an operation dependent on a provided reference signal. For this purpose, the operating circuitry 102 has a reference-signal-input node 104.

The global reference circuitry 80 effectively has three global reference grids (or nodes) 120A, 120B and 120C, each generally corresponding to the global reference grid 12 of FIG. 1. That there are three global reference grids is merely a convenient example which aligns with the discussion of FIG. 3 above (as will become apparent). In general, where technique T2 is employed, two or more such global reference grids may be employed and this consideration will be understood to apply generally.

Figure 4B:
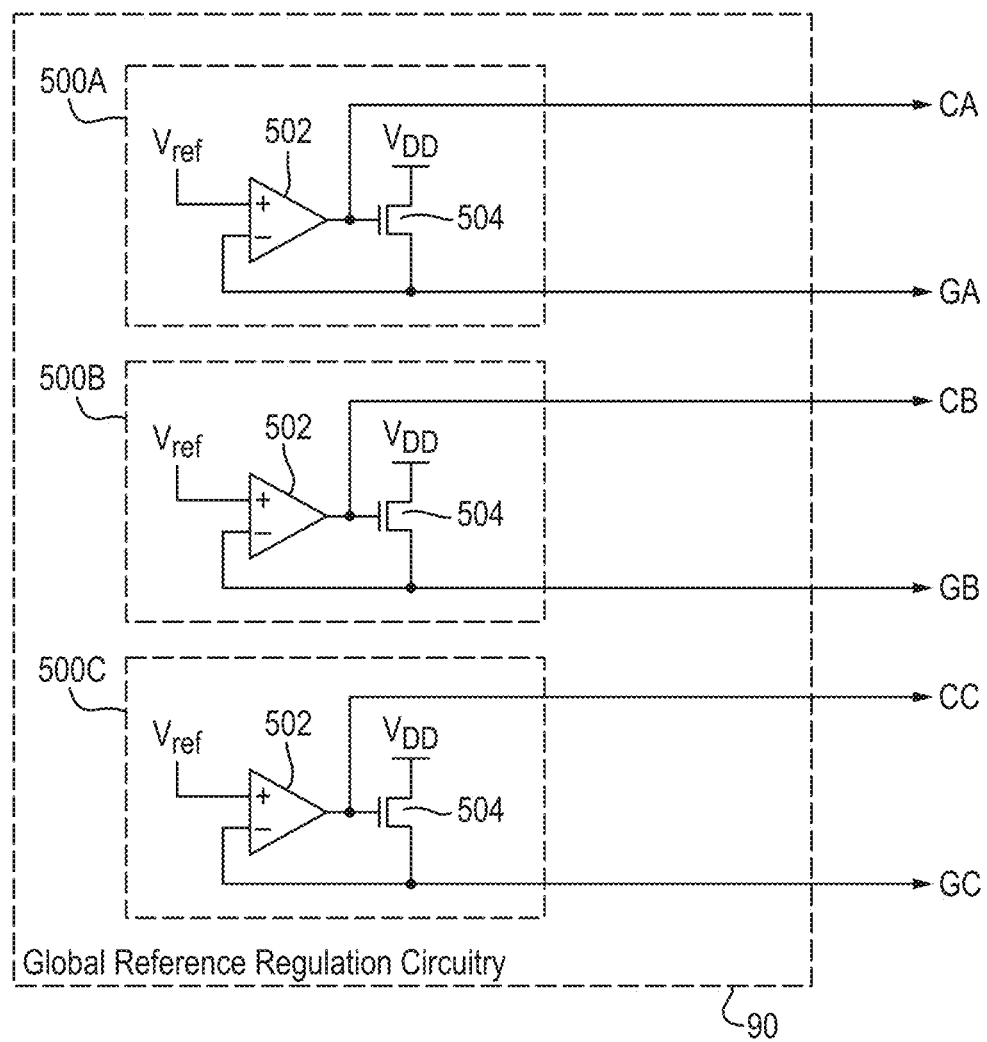
FIG. 4B is a schematic diagram of part of the system circuitry of FIG. 4A.

The global reference regulation circuitry 90 is considered in more detail in FIG. 4B. The global reference regulation circuitry 90 provides global signals GA to GC to the global reference grids 120A, 120B and 120C, respectively. If the control signals CA to CC are not employed, then the global reference regulation circuitry 90 regulates the global signals GA to GC centrally (globally) so that reference signals on the global reference grids 120A, 120B and 120C are regulated.

In other arrangements, the global reference regulation circuitry 90 also provides control signals CA to CC to local regulator circuits 250A, 250B, 250C provided in the operating unit 100, respectively, to regulate reference signals locally within the operating unit 100. In this case, the global reference regulation circuitry 90 may or may not regulate the global signals GA to GC centrally (globally).

The global reference grids (or nodes) 120A, 120B and 120C have respective global decoupling capacitors 122A, 122B and 122C, for noise filtering. Although these capacitors are not essential in all arrangements, it can be beneficial to provide them for noise performance.

The operating unit 100 has three local reference grids (or nodes) 220A, 220B end 220C corresponding to the global reference grids 120A, 120B and 120C, respectively. Each of these local reference grids 220A, 220B and 220C is connected to a respective terminal of a switch 230 so that a corresponding reference signal may be provided to the reference-signal-input node 104 for use by the operating circuitry 102.

The global reference grids 120A, 120B and 120C are then connected to the local reference grids 220A, 220B and 220C, respectively, so that reference signals are distributed as required to those local reference grids 220A, 220B and 220C. The global reference grids 120A, 120B and 120C are connected to the local reference grids 220A, 220B and 220C via respective filters 240A, 240B and 240C and local reference nodes L. For the avoidance of doubt, the global reference grids 120A, 120B and 120C are provided in common to the operating units 100 (only one operating unit shown in FIG. 4A), whereas the local reference grids 220A, 220B and 220C are provided per operating unit 100.

Each local regulation circuit 250A, 250B, 250C has an input terminal (not shown) connected to receive the corresponding control signal CA, CB, CC as mentioned above, and is operable based on that control signal to provide a regulated reference signal at its corresponding local reference node L based on the received control signal.

Respective local decoupling capacitors 260A, 260B, 260C are connected effectively at the local reference grids 220A, 220B, 220C as shown, also for noise filtering. In some arrangements, and as tong as layout area permits, it is beneficial to employ as many such local decoupling capacitors as possible as compared to the global decoupling capacitors, so that noise interference from one operating unit 100 to another can be minimised.

Generally speaking, the circuitry between the global reference grids (or nodes) 120A, 120B and 120C and the local reference grids (or nodes) 220A, 220B and 220C may be considered distribution circuitry comprising one or more distribution circuits.

FIG. 4B is a schematic diagram of the global reference regulation circuitry 90 of the ADC circuitry 1000.

As indicated in FIG. 4B, voltage regulators 500A, 500B, 500C are provided for the global reference grids 120A, 120B and 120C, respectively. The voltage regulators 500A, 500B, 500C control the local regulation circuits 250A, 250B, 250C, respectively, if they are present/connected for use. The voltage regulators 500A, 500B, 500C are basically the same as one another, and the voltage regulator 500A will be described as an example.

The voltage regulator 500A comprises a differential amplifier (e.g. operational amplifier) 502 and a transistor 504, in this case an NMS MOSFET. The transistor 504 is connected at its drain terminal to draw current from a high voltage source (e.g. VDD) under control at its gate terminal by the differential amplifier 502. The differential amplifier 502 is connected to receive a reference voltage signal Vref at one of its input terminals and a voltage signal from the source terminal of the transistor 504 at its other input terminal as a feedback signal. Thus, the differential amplifier 502 and transistor 504 serve to regulate a reference signal at the source terminal of the transistor 504 such that its voltage level tracks Vref.

The signal GA is generated at the source terminal of the transistor 504, and the signal CA is generated at the output of the differential amplifier 502 as indicated. The signal GA is provided to the global reference grid 120A and the signal CA is provided (in some arrangements) to the local regulation circuit 250A. It will become apparent that when the signal CA is provided to the local regulation circuit 250A the transistor 504 could be (but need not be) removed.

Similar considerations apply to the voltage regulators 500B and 500C, which generate signals CB and GB, and CC and GC, respectively, as shown.

Turning then to the first technique T1, the idea is effectively to place local reference sources (i.e. circuitry which regulates local reference signals) inside each operating unit 100, close to the operating circuitry 102 which operates based on the reference signals. Looking at FIG. 4A, the local regulation circuits 250A, 250B, 250C serve as these local reference sources (see the label T1), however for this technique it is only necessary to focus on one of them per operating unit 100, such as local regulation circuit 250A.

In the case of sub-ADC units operating based on charge-redistribution on capacitors, the capacitors may be charged/discharged based on current drawn over the reference signal.

A benefit of technique T1 is that at least some of the current drawn over reference signals by the operating circuitry 102 of the operating units 100 does not need to be directed along wide distances. If, for example, the reference signals used by the operating circuitry 102 of the operating units 100 were provided exclusively via the global reference circuitry 80 (in the sense of such currents being drawn via the global reference circuitry 80), then there would be the problem of significant IR drops along the circuitry distributing those signals across the array of operating units 100 (consider the layout in FIG. 1). Further, there may be unequal IR voltage drops (i.e. due to current flowing through the resistance of the distribution circuitry) between the operating units 100 since they may be located at different distances from where in the global reference circuitry 80 the reference signals are generated/regulated. Generally, the lower the IR drop the lower the noise interference between operating units 100.

Thus, by providing the local regulation circuits 250A, 250B, 250C, the IR drops per operating unit 100 and thus for all of the operating units 100 are reduced, as some of the required current is drawn from via those local regulation circuits 250A, 250B, 250C from a voltage supply rather than via the global reference circuitry 80. Speed is also improved, in that regulation of the reference signals is provided locally and can respond quicker to changes in the voltage level, both by being closer to the operating circuitry 102 and by only needing to regulate the reference signal for a single operating unit 100. The distribution of reference signals in the respective operating units 100 from e.g. the local reference node L to the operating circuitry 102 may also be equal for all operating units 100, ensuring the same conditions in all operating units 100.

In contrast, if the reference signals used by the operating circuitry 102 of the operating units 100 were provided exclusively from the global reference circuitry 80, the regulation (of the global reference regulation circuitry 90) would be close to some operating units 100 and distant for others, causing load-dependent (location-dependent) IR drops and unbalanced operation of the operating units 100. In the case of sub-ADC units, pattern dependent errors could occur in the output digital values.

Looking at FIG. 4A, the local reference nodes L (i.e. local sources) are all ultimately connected to a respective global reference grid 120A, 120B, 120C in the global reference circuitry 80 so that they can operate based on a global reference signal. Such a global reference could then be (but need not be) regulated in the global reference circuitry 80, and such regulation could be lower-speed regulation. By connecting the local reference nodes L (i.e. local sources) to a respective global reference grid 120A, 120B, 120C, it can be ensured that the DC (voltage) level of the local reference signals (at local reference node L) connected to any one global reference grid 120A, 120B, 120C is the same for all operating units 100. The relevant control signal (e.g. CA) is also provided in common to the local regulation circuits (e.g. 250A) which have the same associated global reference grid (e.g. 120A).

In this regard, reference is made to FIG. 5 which is a schematic diagram indicating one example way in which this global-and-local regulation may be implemented. In FIG. 5, only one of the global reference grids 120A of the global reference circuitry 80 is shown by way of example, and this is shown connected to the local reference grid 220A of multiple operating units 100 via corresponding local reference nodes L. Various components such as the filters 240A have been omitted for simplicity, and indeed in some embodiments they need not be provided.

As indicated in FIG. 5, the voltage regulator 500A is provided in the global reference regulation circuitry 90 and connected to the global reference grid 120A by way of global signal GA so as to regulate a reference signal provided on that grid. The reference signal on the global reference grid 120A is distributed to the local reference nodes L of the respective operating units 100.

As indicated in FIG. 5, the local regulation circuit 250A may be implemented as a source-follower transistor 252A, in this case an NMOS MOSFET. Looking at one of the local regulation circuits 250A, the transistor 252A is connected at its drain terminal to draw current from a high voltage source (e.g. VDD) under control at its gate terminal by the control signal CA. The source terminal of the transistor 252A then effectively is connected to the local reference node L concerned. Thus, the transistor 252A serves to regulate a reference signal at its source terminal (and thus on the local reference grid 220A concerned) such that its voltage level also tracks Vref.

Again, looking at one of the local regulation circuits 250A, it will be appreciated that the gate terminal of the transistor 252A (effectively the input terminal of the local regulation circuits 250A) has a high input impedance, being a gate terminal, so that a relatively low amount of current is drawn on the shared control signal (net) CA. The local regulation circuit 250A is configured to draw a relatively high amount of current from the high voltage source (i.e. from the supply) and provide that current to the operating circuitry 102 concerned at the local reference node L, but this current flows over a much shorter distance (i.e. within the operating unit 100) and this arrangement can be the same between the operating units 100 (hence better matching of IR drops). Also, not all of the current drawn at the local reference node L by the operating circuitry 102 (not shown) is drawn from the global reference circuitry 80 (hence lower IR drops).

Another possibility would be to place voltage regulators like voltage regulator 500A within each operating unit 100, albeit with the increased component count and area overhead.

Incidentally, it would be possible to remove or disconnect the transistor 504 as mentioned earlier, so that the regulation effectively takes effect locally (within the operating units 100) by the transistors 252A and not globally by the transistor 504. In this case, the presence of the filters 240A may be desirable. With the transistor 504 and the transistors 252A, regulation takes effect both globally and locally.

As mentioned above, it is not essential that the first technique T1 be employed in all embodiments. If technique T1 were not employed, the local regulation circuits 250A, 250B, 250C could be removed or disconnected (and control signals CA, CB, CC would not be needed, but the transistors 504 would be). In that case, the benefits of the first technique T1 would not be enjoyed, however the benefits of one or more of the other techniques may be enjoyed.

Turning next to the second technique T2, the idea is effectively to provide separate reference signals to each operating unit 100, at separate local reference grids 220A, 220B and 220C. The idea, in line with the discussion of FIG. 3, is that these separate reference signals may have the same (or in some cases different) nominal DC voltage level, but may have different noise levels. The reference signals may be graduated from most noisy to cleanest (least noisy) from local reference grid 220A to 220B to 220C for the sake of argument. The operating circuitry 102 of the operating unit 100 concerned could then use its switch 230 to use the reference signals on different local reference grids 220A, 220B and 220C for different operations. Control circuitry (not shown) may be provided per operating unit 100 or (with some degree of complexity in distributing control signals) centrally in the system (e.g. ADC) circuitry 1000 in order to control the switches 230 so as to select the appropriate reference signals for each operation.

In the context of (e.g. non-binary) SAR sub-ADC units, and looking at FIG. 3, it would then be possible to use the reference signal on local reference grid 220A for sub-conversion operations of group I (which can tolerate the most noise in the reference signal and also inject the most noise into the reference signal), the reference signal on local reference grid 220B for sub-conversion operations of group II (which can tolerate a medium amount of noise in the reference signal and also inject a medium amount of noise into the reference signal), and the reference signal on local reference grid 220C for sub-conversion operations of group III (which can tolerate the least noise in the reference signal and also inject the least noise into the reference signal).

This way, by using multiple (two or more) reference voltage signals inside each operating unit 100 it is possible to balance a level of noise contamination during different sub-conversion operations, especially taking into account time-interleaved operation. Recall that (looking back to FIG. 3), in the time period P, the third sub-ADC unit 10 carries out its group I sub-conversion operations, the second sub-ADC unit 10 carries out its group II sub-conversion operations and the first sub-ADC unit 10 carries out its amp III sub-conversion operations. Thus, while the first sub-ADC unit 10 is most sensitive to noise and generates the least noise, the third sub-ADC unit 10 is least sensitive to noise but generates the most noise.

Returning to FIG. 4A, in order to provide separate reference signals to an operating unit 100 at its separate local reference grids 220A, 220B and 220C, the corresponding global reference grids 120A, 120B and 120C are provided (see the label T2). Note also the corresponding filters 240A, 240B and 240C (which are not essential for technique T2, but may be used in some arrangements).

Figure 6A:
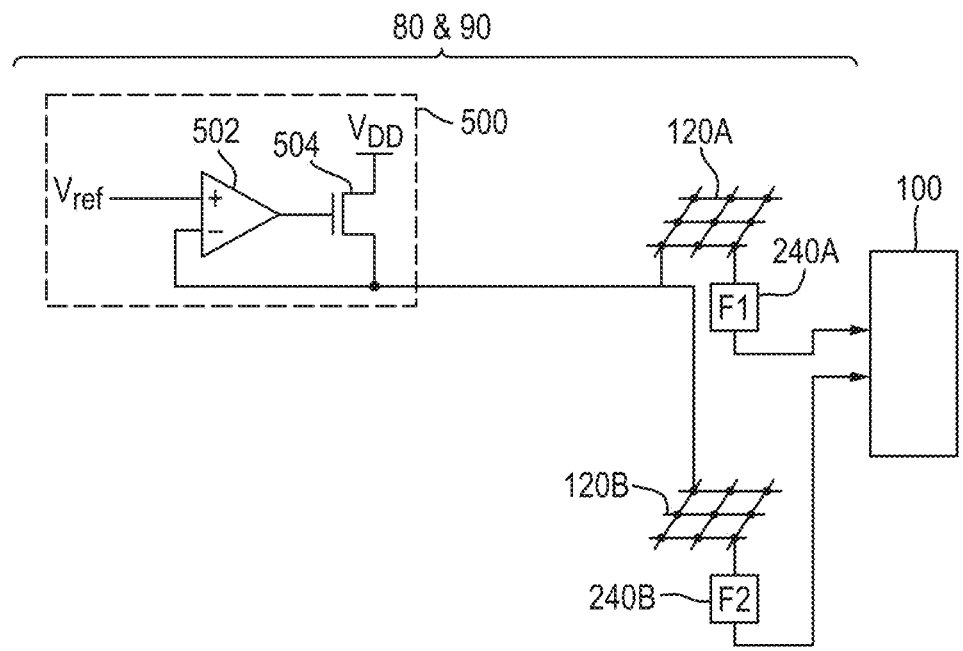
Figure 6B:
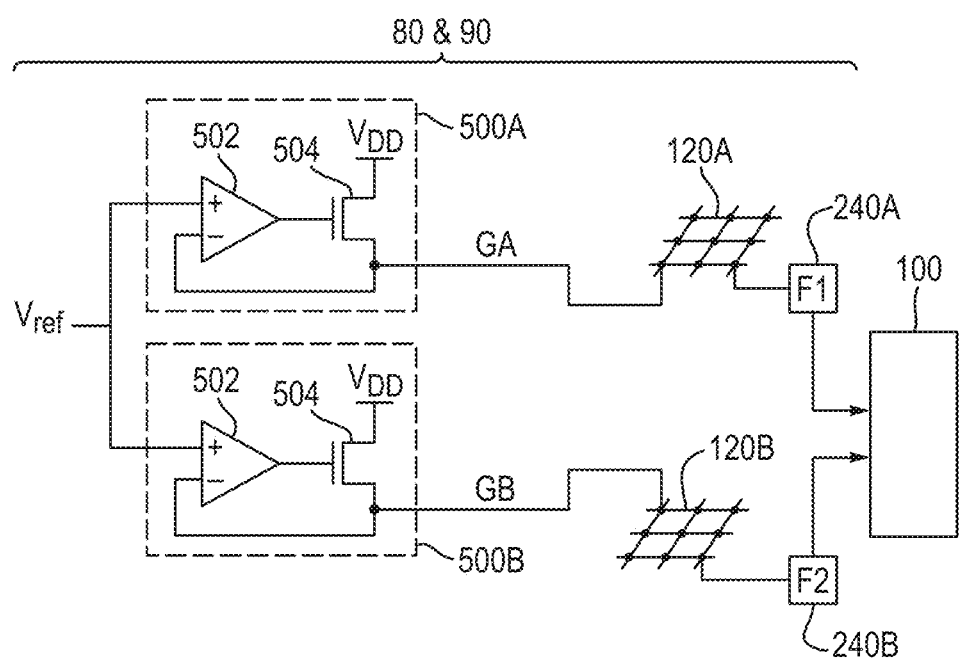

In this regard, reference is made to FIG. 6 which is a schematic diagram indicating two example ways, (a) and (b), ire which separate reference signals may be provided to an operating unit 100 at its separate local reference grids 220A, 220B and 220C. In some arrangements, FIG. 6(b) is preferred to FIG. 6(a).

In FIGS. 6(a) and 6(b), only two of the global reference grids 120A and 120B of the global reference circuitry 80 are shown by way of example, and these are shown connected to a single operating unit 100, for simplicity. Various components such as the global decoupling capacitors and the local decoupling capacitors have been omitted for simplicity, but are assumed to be present. The local decoupling capacitors in particular are desirable as mentioned above.

In FIG. 6(a), a voltage regulator 500 (any of the voltage regulators 500A, 500B, 500C of FIG. 46) is provided and connected to the global reference grids 120A and 120B so as to regulate a reference signal provided on both of those grids. In this respect, the global reference grids 120A and 120B could be considered to be the same grid. However, the filters 240A and 240B (indicated as F1 and F2 respectively) are different from one another so that the reference signals provided at the operating unit 100 via them are different (in terms of noise) by virtue of having been filtered differently. Those reference signals have also been distributed separately at least from the global reference grids 120A and 120B onwards, via separate distribution circuits. The distribution circuits are separate from one another, e.g. electrically separate or decoupled from one another (at least over a frequency range of interest).

In FIG. 6(b), separate voltage regulators 500A and 500B (as in FIG. 4B) are provided for the global reference grids 120A and 120B, respectively, so as to regulate respective reference signals provided on those grids separately or independently. The global reference grids 120A and 120B here are separate from one another, e.g. electrically separate or decoupled from one another (at least over a frequency range of interest). The filters 240A and 240B (indicated as F1 and F2 respectively) may be different from one another or the same as one another. The filters 240A and 240B also may be omitted.

The reference signals provided at the operating unit 100 may thus be different (in terms of noise) and separate by virtue of having been regulated separately (and potentially also filtered differently). Those reference signals have also been distributed separately from the separate voltage regulators 500 onwards, via separate distribution circuits. The distribution circuits are again separate from one another, e.g. electrically separate or decoupled from one another (at least over a frequency range of interest).

Incidentally, the DC voltage levels of the two voltage regulators 500 in FIG. 6(b) are shown to be the same as they are both connected to receive Vref, however they may instead be provided with different reference signals Vref1 and Vref2, respectively, so that they can be provided with different DC voltage levels. This may help reduce overall reference-noise contribution.

Based on the example of SAR sub-ADC units, during first MSB conversions the most noisy reference signal may be applied. Moving on more and more accurate (i.e. less noisy) references signals may be used instead. The benefit of this approach is based on the fact that during the more charge-demanding MSB conversions (in the context of charge redistribution sub-ADC units) the highest amount of noise per conversion is injected but at the same time higher noise can be tolerated particularly in a non-binary conversion scheme. During LSB conversions more accurate references are required and fortunately less noise is injected as charging/discharging is lower.

It will be understood that the different global reference grids (e.g. grids 120A and 120B as in FIG. 6) will need to be implemented in an interleaved way (i.e. have an interleaved topology) to minimize routing distances towards the different operating unite 100. The operating units 100 may have the local regulation circuits 250A, 250B, 250C of the first technique T1, with the voltage regulators 500A, 500B, 500C serving those local regulation circuits 250A, 250B, 250C. The filters 240A, 240B and 240C may also be present. The global decoupling capacitors 122A, 122B, 122C and the local decoupling capacitors 260A, 260B, 260C are helpful where there is such separation between global and local reference grids.

As mentioned above, it is not essential that the second technique T2 be employed in all embodiments. If technique T2 were not employed, there could effectively be a single global reference grid connected to a single local grid per operating unit 100, and the switch 230 need not be provided (i.e. a direct connection may be made to the single local grid). In that case, the benefits of the second technique T2 would not be enjoyed, however the benefits of one or more of the other techniques may be enjoyed.

Turning next to the third technique T3, the idea is effectively to configure e switches 230 (see the label T3 in FIG. 4A) so that they are balanced, in that, as they switch from one reference signal to the next, i.e. from one local reference grid to the next (such as from grid 220A to 220B to 220C), there is substantially zero net charge injection into the reference-signal-input node 104 concerned.

Switching between reference signals may otherwise inject into the reference-signal-input node 104 which may impact the operations ca out by the operating circuitry 102. In the context of SAR sub-ADC units, this may impact the sub-conversion operations or at least require an increased waiting time for settling.

In this regard, reference is made to FIG. 7 which is a schematic diagram indicating how the switches 230 may be implemented for such balanced switching. For simplicity, the switching only for one operating unit 100 is considered, and also only between two of the available reference signals, i.e. from local reference grid 220A to local reference grid 220B. However, it will be appreciated that the same considerations apply to other operating units 100, and also to switching from local reference grid 220B to local reference grid 220C (with switches 230 expanded accordingly). Here, as previously, it is assumed that the order in which the reference signals are used by the operating circuitry equates to switching from grid 220A to 220B to 220C.

The basic idea is, when switching from one local reference grid to the next, for the two associated switching events—'switching off one reference' and 'switching on the next reference'—to be balanced with respect to injected charge.

In FIG. 7, the switch 230 is implemented with two transistors 510A and 510B, here MOSFETs, connected to a common tail node 512 which corresponds to the reference-signal-input node 104. The transistor 510A is connected to the local reference grid 220A, and the transistor 510B is connected to the local reference grid 220B. The transistors 510A and 510B may be implemented as PMOS or NMOS transistors, or even as parallel-connected PMOS and NMOS transistor pairs.

Charge injection is caused by the voltage swing at the gate terminals of the transistors 510A and 510B for the two associated switching events charging/discharging the gate capacitances. In this respect, the voltage change at the gate terminals is indicated in FIG. 7 as $\Delta V$ (assumed to be negative for transistor 510A as it turns off, and positive for transistor 510B as it turns on, and to be the same magnitude for both for simplicity).

Also shown in FIG. 7 are the effective gate capacitances CgdA (gate-drain capacitance) and CgsA (gate-source capacitance) for transistor 510A, and similarly the effective gate capacitances CgdB (gate-drain capacitance) and CgsB (gate-source capacitance) for transistor 510B. Of course, these are effective capacitances rather than added components.

The change of charge $\Delta Q_A$ as transistor 510A turns off is thus:

$$\Delta Q_A = -\Delta V \cdot CgsA$$

The change of charge $\Delta Q_B$ as transistor 510B turns on is similarly:

$$\Delta Q_B = \Delta V \cdot (CgsB + CgdB)$$

Assuming that CgsA=CgdA, and that CgsB=CgdB, which is usual for MOSFETs, then for zero net charge infection into the reference-signal-input node 104 for the two associated switching events:

$$\Delta Q_A + \Delta Q_B = 0$$

and thus $$CgsA = CgsB + CgdB = 2 \cdot CgsB$$

As Cgs is proportional to the transistor width (the number of fingers), the ratio of width or number of fingers (i.e. the transistor size) between transistor 510A (turning off) and transistor 510B (turning on) in this case should be 2. That is, the transistor turning off in this case should be twice the size of the transistor turning on. A similar relationship may be had between transistor 510B (then turning off) and a transistor 510C (turning on), if transistor 510C were provided connected between the common tail node 512 and local reference grid 220C to take care of all three reference signals provided in FIG. 4A.

It will be appreciated that this size relationship may, within practical limits, be extended to any number of transistors within switch 230 if there are further reference signals. Also, the relationship is dependent on the ratio between the gate-source capacitance and the gate-drain capacitance and on the voltage changes applied at the gate terminals.

As mentioned above, it is assumed that the transistors 510A, 510B, 510C are controlled by a control signal (see signal CONTROL in FIG. 4A) so as to control when they are turned on or off in synchronisation with the operations performed by the operating circuitry 102. As before, the control signals may be provided by control circuitry (not shown) per operating unit 100 or global control circuitry (not shown) of the system (e.g. ADC) circuitry 1000.

As mentioned above, it is not essential that the third technique T3 be employed in all embodiments, although it of course fits readily with technique T2. If technique T3 were not employed, the switch 230 would not have such a balanced switching operation. In that case, the benefits of the third technique T3 would not be enjoyed, however the benefits of one or more of the other techniques may be enjoyed.

Turning finally to the fourth technique T4, the idea is effectively to have the separation between the local reference grids 220A, 220B and 220C and their respective global reference grids 120A, 120B and 120C.

Looking at a single global reference grid such as grid 120A as an example, the idea is to have a dedicated local reference grid 220A per operating unit 100 which is connected to the shared global reference grid 120A through a filter structure, here filter 240A (see the label T4 in FIG. 4A).

It will thus be appreciated that such a filter 240A will be present per operating unit 100.

In this regard, reference is made to FIG. 8 which is a schematic diagram indicating how the filters may be implemented, focusing on filter 240A by way of example.

As shown in FIG. 3(a), the filter 240A may be implemented as a simple resistor (although more complex filter circuitry may of course be used instead). By implementing this resistor as a tuneable transistor 522 as in FIG. 8(b), e.g. as a MOSFET operating in the linear region, the resistance value may be tuneable by controlling the gate voltage. By implementing the resistor as an array of parallel connected tuneable transistors 522 as in FIG. 8(c), e.g. as MOSFETs operating in the linear region, the resistance value may again be tuneable by controlling the gate voltages. Further, additional switching circuitry (not shown) may be provided to switch those parallel-connected transistors 522 into or out of circuit to affect the resistance value.

Taking into account the global decoupling capacitors 122A and the local decoupling capacitors 260A, and/or parasitic capacitances of the distribution circuitry in general, this way the system (e.g. ADC) circuitry 1000 provides a global charge reservoir at the global grid level while the filter mechanism provided by the filters 240A per operating unit 100 protect the global reference grid 120A against high frequency noise contamination from the operating units 100. The separated local reference grid 220A per operating unit 100, with the local decoupling capacitor 260A, can still maintain a relatively fast settling behaviour. This may be advantageous e.g. for non-binary SAR sub-conversion operations in the context of SAR sub-ADC units. This arrangement is shown in FIG. 9, for multiple operating units 100 and using the filter 240A of FIG. 8(a). Where more settling time is tolerable, the filters 240A may be designed to be stronger (e.g. higher resistance, leading to a lower cut-off frequency of the associated low pass filter) and the better the global reference grid 120A may be protected from noise from the operating units 100.

Incidentally, if technique T4 is combined with T2 (with SAR sub-ADC units in mind as above, which use local grids 260A, 260B, 260C in that order from MSB sub-conversions down to LSB sub-conversions), the filter resistance of 240C should be higher than resistance of 240B which again should be higher than resistance of 240A. This is on the one hand is possible as the capacitance changes inside operating circuitry 102 during later SAR sub-conversions are smaller and on the other hand is beneficial as more noise filtering is desirable during later SAR sub-conversions.

As mentioned above, it is not essential that the fourth technique T4 be employed in all embodiments. If technique T4 were not employed, the filters 240A, 240B, 240C in FIG. 4A could be replaced by direct connections between the global and local reference grids so that there is effectively no distinction between them. In that case, the benefits of the fourth technique T4 would not be enjoyed, however the benefits of one or more of the other techniques may be enjoyed.

In general therefore it will be apparent that the techniques T1 to T4 may be combined in any combination having one or more of them, each combination giving rise to a different class of embodiment. It will be appreciated, from the reference to SAR sub-ADC units in respect of the operating units 100, that such embodiments can be applied to any (e.g. non-binary) distributed SAR ADC design.

By combining all of the techniques T1 to T4 as in FIG. 4A, it will be appreciated that the benefits of all of them may be enjoyed and that their functionality may enable optimized noise balancing in the system (e.g. ADC) circuitry 1000. That is, their functionality may be tuned for example for well-adjusted noise balancing for distributed non-binary SAR sub-ADC units. For example, the different techniques may be directed at keeping noise in different frequency ranges low.

Low frequency noise may be compensated through regulation at the global and/or local reference grids.

High frequency noise and e.g. voltage drops which occur immediately after switching events e.g. at switches 230 or within the operating circuitry 102, may be limited (blocked or filtered out) by the local regulation circuitry REG (e.g. the source follower transistors 252A). These quickly feed in or lead off charge at the local reference nodes L. In addition, the local decoupling capacitors 260A, 260B, 260C help to smooth voltage ripples. Both arrangements not only help prevent high frequency noise from affecting the global reference grids but also define the required settling time for local sub-conversion operations.

For closing the gap of mid-frequency noise—above the cut-off frequency of the global regulation and below the high-frequency filtering effect associated with the source-follower transistor 252A resistance and local decoupling capacitance 260A—the much larger sum of all connected local capacitors 260A, 260B, 280C and the global decoupling capacitors 122A, 122B, 122C in combination with the filter resistance of filters 240A, 240B, 240C come into play. The filter resistance can be set so that 1/(Rfilter*Clocal) is higher than the global regulator bandwidth. If the resistance is too low high-frequency noise transfer to other operating units 100 increases.

FIG. 10 is a schematic diagram of an integrated circuit 2000 embodying the present invention. The integrated circuit 2000 comprises the system (e.g. ADC) circuitry 1000, and thus any of the embodiments disclosed above. The system circuitry 1000 may be ADC circuitry as mentioned above. It will be appreciated that the circuitry disclosed herein could be described as an ADC.

Circuitry of the present invention may be implemented as integrated circuitry, for example on an IC chip such as flip chip. Thus, the integrated circuit 2000 may be an IC chip. The present invention extends to integrated circuitry and IC chips as mentioned above, circuit boards comprising such IC chips, and communication networks (for example, internee fiber-optic networks and wireless networks) and network equipment of such networks, comprising such circuit boards.

It will incidentally be noted that the various transistors disclosed herein (e.g. transistors 604 and 252) could be implemented as BJTs rather than as MOSFETs or FETs. For example, in the case of the source-follower (FET) transistors, when implemented as BJTs they could be described as emitter followers. The present disclosure will understood accordingly.

In any of the above aspects, the various method features ray be implemented in hardware, or as software modules running on one or more processors. Features of one aspect may be applied to any of the other aspects. The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

The present invention may be embodied in many different ways in the light of the above disclosure, within the spirit and scope of the appended claims.

The present disclosure extends to the following numbered statements, which define embodiments. The comments in square brackets (e.g. [1+2]) are for the assistance of the reader.

A: Inv1 (T1)

A1. Semiconductor integrated circuitry [1], comprising:
a plurality of operating units each comprising a local regulation circuit, a local reference node and operating circuitry, and each operating unit being operable to carry out an operation dependent on a reference signal provided at its local reference node; and
reference regulation circuitry which comprises the local regulation circuits and is connected to provide respective reference signals at the local reference nodes,
wherein, for each of the operating units;
the local regulation circuit has an input terminal connected to receive a control signal from the reference regulation circuit and is configured to regulate a reference signal at the local reference node based on the received control signal;
the input terminal of the local regulation circuit has a high input impedance so that a relatively low amount of current is drawn from the reference regulation circuitry by the input terminal; and
the local regulation circuit is configured to draw a relatively high amount of current from a voltage supply and provide that current to the operating circuitry concerned at the local reference node.

A2. The semiconductor integrated circuitry [1] according to statement A1, comprising a global reference node and a distribution circuit,
wherein:
the local reference nodes of the operating circuits are connected to the global reference node via the distribution circuit; and
for each operating unit, the local regulation circuit is configured to draw said relatively high amount of current from the voltage supply and provide that current to the operating circuitry concerned at the local reference node so that a part of a current drawn by the operating circuitry from the local reference node is provided from the voltage supply by the local regulation circuit rather than from the global reference node.

A3. The semiconductor integrated circuitry [1] according to statement A1 or A2, wherein, for each operating unit;
the local regulation circuit comprises a transistor configured as a source-follower or emitter-follower transistor;
the input terminal of the local regulation circuit is the gate or base terminal of the source-follower or emitter-follower transistor; and
the local regulation circuit is configured to provide said relatively high amount of current to the operating circuitry from the source or emitter terminal of the source-follower or emitter-follower transistor.

A4. The semiconductor integrated circuitry [1+2] according to any of statements A1 to A3, wherein:
each operating unit comprises first to Nth said local regulation circuits and first to Nth said local reference nodes, where N is an integer and N≥2;
each operating unit comprises switching circuitry;
for each operating unit, the operating circuitry is operable to carry out a series of first to Nth operations each dependent on a corresponding reference signal, each of the N operations having a corresponding noise tolerance level of first to Nth noise tolerance levels, those N noise tolerance levels being different from one another;

the reference regulation circuitry comprises the N local regulation circuits of each of the operating units and is connected, for each operating unit, to provide first to Nth respective separate reference signals at its N local reference nodes;

the semiconductor integrated circuitry comprises control circuitry;

X is an integer variable ranging from 1 to N;

the control circuitry is configured, for the operating unit, to control its switching circuitry as the N operations are carried out to selectively connect its operating circuitry to its local reference nodes so that its operating circuitry employs the Xth reference signal provided at its Xth local reference node as the reference signal for its Xth operation; and each noise tolerance level is a level of noise in the employed reference signal which the operation concerned can tolerate.

A5. The semiconductor integrated circuitry [1+2] according to statement A4, comprising:

first to Nth said global reference nodes; and first to Nth said distribution circuits, wherein:

for each value of X, the Xth local reference nodes of the operating circuits are connected to the Xth global reference node via the Xth distribution circuit.

A6. The semiconductor integrated circuitry [1+2] according to statement A5, wherein:

the reference regulation circuitry comprises first to Nth reference regulation circuits;

the first Nth reference regulation circuits comprise first to Nth global regulation circuits;

for each value of X, the Xth reference regulation circuit comprises the Xth local regulation circuits of the operating units; and for each value of X, the Xth reference regulation circuit is configured to regulate the respective reference signals provided at the Xth local reference nodes and a reference signal provided at the Xth global reference node.

A7. The semiconductor integrated circuitry [1+2] according to statement A6, wherein:

for each value of X, the Xth distribution circuit is electrically decoupled from the other distributions circuits over a given noise frequency bandwidth between the Xth global reference node and the Xth local reference nodes; and/or for each value of X, the Xth distribution circuit is electrically separate from the other distributions circuits between the Xth global reference node and the Xth reference nodes.

A8. The semiconductor integrated circuitry [1+2, 1+2+4] according to statement A6 or A7, wherein:

the N reference regulation circuits are configured to regulate their reference signals independently of one another [FIG. 6b]; or the N distribution circuits each connect their local reference nodes to their global reference node via respective filter circuits, the filter circuits of each said distribution circuit are different from the filter circuits of each other said distribution circuit, and the N reference regulation circuits share a common regulator so that they regulate the reference signals at their global reference nodes in a single regulation operation [FIG. 6a].

A9. The semiconductor integrated circuitry [1+2] according to any of statements A4 to A8, wherein the operating units are configured to carry out their respective series of operations in a time-interleaved manner so that different operating units are at different stages in their respective series of N operations at the same time.

A10. The semiconductor integrated circuitry [1+2] according to any of statements A4 to A9, wherein the Xth noise tolerance level is lower than the X−1th noise tolerance level for each value of X from 2 to N.

A11. The semiconductor integrated circuitry [1+2] according to any of statements A4 to A10, wherein each of the N operations has a corresponding noise injection level of first to Nth noise injection levels, those N noise injection levels being different from one another, wherein each noise injection level is a level of noise which the operation concerned injects into the employed reference signal at the local reference node concerned, optionally wherein the Xth noise injection level is lower than the X−1th noise injection level for each value of X from 2 to N.

A12. The semiconductor integrated circuitry [1+2] according to any of statements A4 to A11, wherein N equals 2 or 3 or 4.

A13. The semiconductor integrated circuitry [1+2+3] according to any of statements A4 to A12, wherein, for each operating unit:

the series of operations comprises carrying out the N operations in an order such that X increases from 1 to N;

the switching circuitry comprises first to Nth switches connecting a reference-signal-input node of the operating circuitry to the first to Nth local reference nodes, respectively;

for each value of X from 1 to N−1, the control circuitry is configured to turn on the Xth switch to provide the reference-signal-input node of the operating circuitry with the reference signal provided at the Xth local reference node for the Xth operation and then turn off the Xth switch and turn on the X+1th switch to provide the reference-signal-input node of the operating circuitry instead with the reference signal provided at the X+1th local reference node for the X+1 th operation; and the switches are sized relative to one another so as to limit or minimize or reduce to zero a net amount of charge injected into the reference-signal-input node of the operating circuitry from the reference nodes when the Xth switch is turned off and the X+1th switch is turned on, for each value of X from 1 to N−1.

A14. The semiconductor integrated circuitry [1+2+3] according to statement A13, wherein:

the switches e each implemented using at least one MOSFET transistor; and the channel widths and lengths of the MOSFET transistors are set so as to limit or minimize or reduce to zero said net amount of charge injected.

A15. The semiconductor integrated circuitry [1+2+3] according to statement A14, wherein:

the reference signals provided at the local reference nodes have substantially the same voltage level as one another;

switching signals provided at the gate terminals of the MOSFET transistors to turn the Xth switch off and the X+1th switch on switch between high and low voltage levels which have the same potential difference between one another, for each value of X from 1 to N−1;

the switches have the same number and arrangement of MOSFET transistors as one another; and the channel widths and lengths of the MOSFET transistors are set so that the gate capacitance Cgs for the at least one MOSFET transistor of the Xth switch is equal to the sum of the gate capacitances Cgs and Cgd for the at least one MOSFET transistor of the X+1th switch, for each value of X from 1 to N−1.

A16. The semiconductor integrated circuitry [1+2+3] according to statement A15, wherein:
the gate capacitances Cgs and Cgd for each of the MOSFET transistors are equal;
the channel lengths of the MOSFET transistors are the same as one another; and
the channel widths of the MOSFET transistors are set so as to limit or minimize or reduce to zero said net amount of charge injected.

A17. The semiconductor integrated circuitry [1+2+3] according to statement A16, wherein the channel width for the at least one MOSFET transistor of the Xth switch is twice the size of the channel width for the at least one MOSFET transistor of the X+1th switch, for each value of X from 1 to N−1.

A18. The semiconductor integrated circuitry [1+4, 1+2+4, 1+2+3+4] according to any of statements A1 to A17, wherein:
each distribution circuit is configured to connect the local reference nodes concerned of each of the operating units to the global reference node concerned via respective independent signal paths; and
each signal path comprises a filter circuit connected therealong.

A19. The semiconductor integrated circuitry [1+4, 1+2+4, 1+2+3+4] according to statement A18, wherein a local decoupling capacitor is connected at each or one or more of the local reference nodes.

A20. The semiconductor integrated circuitry [1+4, 1+2+4, 1+2+3+4] according to statement A18 or A19, comprising a global decoupling capacitor connected to the global reference node.

A21. The semiconductor integrated circuitry [1+4, 1+2+4, 1+2+3+4] according to any of statements A18 to A20, wherein each filter circuit is implemented as a resistance.

A22. The semiconductor integrated circuitry [1+4, 1+2+4, 1+2+3+4] according to statement A21, wherein the resistance comprises one or more resistors connected together in parallel and/or in series.

A23. The semiconductor integrated circuitry [1+4, 1+2+4, 1+2+3+4] according to statement A22, wherein each resistor is implemented as a MOSFET transistor configured to operate in its linear region.

A24. The semiconductor integrated circuitry [1+4, 1+2+4, 1+2+3+4] according to any of statements A18 to A23, wherein the independent signal paths are:
electrically decoupled from each other over a given noise frequency bandwidth between the global reference node and the local reference nodes concerned; and/or
electrically separated from each other between the global reference node and the local reference nodes concerned.

A25. The semiconductor integrated circuitry [any] according to any of statements A1 to A24, wherein:
each said operation generates a result dependent on a level of noise in the employed reference signal; and/or
each said operation generates a result dependent or a data signal and the employed reference signal.

A26. The semiconductor integrated circuitry [any] according to any of statements A1 to A25, wherein:
said reference signals are voltage signals; and/or
said reference signals have substantially the same magnitude as one another.

A27. The semiconductor integrated circuitry [any] according to any of statements A1 to A26, wherein each said operation comprises one or more sub-operations.

A28. The semiconductor integrated circuitry [any] according to any of statements A1 to A27, wherein each said operating unit is a successive approximation ADC unit, and wherein each said operation comprises one or more comparison operations and/or wherein each said operating unit is configured to carry out non-binary conversion.

A29. The semiconductor integrated circuitry [any] according to any of statements A1 to A28, being an analogue-to-digital converter.

A30. An analogue-to-digital converter comprising the semiconductor integrated circuitry [any] according to any of statements A1 to A29.

B: Inv2 (T2)

B1. Semiconductor integrated circuitry [2], comprising:
an operating unit comprising operating circuitry, switching circuitry and first to Nth local reference nodes, where N is an integer and N≥2, the operating circuitry being operable to carry out a series of first to Nth operations each dependent on a corresponding reference signal, each of the N operations having a corresponding noise tolerance level of first to Nth noise tolerance levels, those N noise tolerance levels being different from one another;
reference regulation circuitry connected to provide first to Nth respective separate reference signals at the N local reference nodes; and
control circuitry,
wherein:
X is an integer variable ranging from 1 to N;
the control circuitry is configured, for the operating unit, to control its switching circuitry as the N operations are carried out to selectively connect its operating circuitry to its local reference nodes so that its operating circuitry employs the Xth reference signal provided at its Xth local reference node as the reference signal for its Xth operation; and
each noise tolerance level is a level of noise the employed reference signal which the operation concerned can tolerate.

B2. The semiconductor integrated circuitry [2] according to statement B1, comprising a plurality of said operating units, wherein:
the reference regulation circuitry is connected, for each operating unit, to provide first to Nth respective separate reference signals at its N local reference nodes; and
the control circuitry is configured, for each operating unit, to control its switching circuitry as the N operations are carried out to selectively connect its operating circuitry to its local reference nodes so that its operating circuitry employs the Xth reference signal provided at its Xth local reference node as the reference signal for its Xth operation.

B3. The semiconductor integrated circuitry [2] according to statement B2, comprising
first to Nth global reference nodes; and
first to Nth distribution circuits,
wherein:
for each value of X, the Xth local reference nodes of the operating circuits are connected to the Xth global reference node via the Xth distribution circuit.

B4. The semiconductor integrated circuitry [2] according to statement B3, wherein:
the reference regulation circuitry comprises first to Nth reference regulation circuits; and
for each value of X, the Xth reference regulation circuit is configured to regulate the respective reference signals provided at the Xth local reference nodes and/or a reference signal provided at the Xth global reference node.

B5. The semiconductor integrated circuitry [2] according to statement B4, wherein:

for each value of X, the Xth distribution circuit is electrically decoupled from the other distributions circuits over a given noise frequency bandwidth between the Xth global reference node and the Xth local reference nodes; and/or for each value of X, the Xth distribution circuit is electrically separate from the other distributions circuits between the Xth global reference node and the Xth local reference nodes.

B6. The semiconductor integrated circuitry [2] according to statement B4 or B5, wherein:

the N reference regulation circuits are configured to regulate their reference signals independently of one another [FIG. 6b]; or the N distribution circuits each connect their local reference nodes to their global reference node via respective fitter circuits, the filter circuits of each said distribution circuit are different from the filter circuits of each other said distribution circuit, and the N reference regulation circuits share a common regulator so that they regulate the reference signals at their global reference nodes in a single regulation operation [FIG. 6a].

B7. The semiconductor integrated circuitry [2] according to any of statements B2 to B6, wherein the operating units are configured to carry out their respective series of operations in a time-interleaved manner so that different operating units are at different stages in their respective series of N operations at the same time.

B8. The semiconductor integrated circuitry [2] according to any of statements B1 to B7, wherein the Xth noise tolerance level is lower than the X−1 th noise tolerance level for each value of X from 2 to N.

B9. The semiconductor integrated circuitry [2] according to any of statements B1 to B8, wherein each of the N operations has a corresponding noise injection level of first to Nth noise injection levels, those N noise injection levels being different from one another, wherein each noise injection level is a level of noise which the operation concerned injects into the employed reference signal at the local reference node concerned, optionally wherein the Xth noise injection level is lower than the X−1th noise injection level for each value of X from 2 to N.

B10. The semiconductor integrated circuitry [2] according to any of statements B1 to B9, wherein N equals 2 or 3 or 4.

B11. The semiconductor integrated circuitry [2+8] according to any of statements B1 to B10, wherein, for each operating unit;

the series of operations comprises carrying out the N operations in an order such that X increases from 1 to N;

the switching circuitry comprises first to Nth switches connecting a reference-signal-input node of the operating circuitry to the first to Nth local reference nodes, respectively;

for each value of X from 1 to N−1, the control circuitry is configured to turn on the Xth switch to provide the reference-signal-input node of the operating circuitry with the reference signal provided at the Xth local reference node for the Xth operation and then turn off the Xth switch and turn on the X+1th switch to provide the reference-signal-input node of the operating circuitry instead with the reference signal provided at the X+1th local reference node for the X+1th operation; and the switches are sized relative to one another so as to limit or minimize or reduce to zero a net amount of charge injected into the reference-signal-input node of the operating circuitry from the reference nodes when the Xth switch is turned off and the X+1th switch is turned on, for each value of X from 1 to N−1.

B2. The semiconductor integrated circuitry [2+3] according to statement B11, wherein:

the switches are each implemented using at least one MOSFET transistor; and the channel widths and lengths of the MOSFET transistors are set so as to limit or minimize or reduce to zero said net amount of charge injected.

B13. The semiconductor integrated circuitry [2+3] according to statement B12, wherein:

the reference signals provided at the local reference nodes have substantially the same voltage level as one another;

switching signals provided at the gate terminals of the MOSFET transistors to turn the Xth switch off and the X+1th switch on switch between high and low voltage levels which have the same potential difference between one another, for each value of X from 1 to N−1;

the switches have the same number and arrangement of MOSFET transistors as one another; and the channel widths and lengths of the MOSFET transistors are set so that the gate capacitance Cgs for the at least one MOSFET transistor of the Xth switch is equal to the sum of the gate capacitances Cgs and Cgd for the at least one MOSFET transistor of the X+1th switch, for each value of X from 1 to N−1.

B14. The semiconductor integrated circuitry [2+3] according to statement B13, wherein:

the gate capacitances Cgs and Cgd for each of the MOSFET transistors are equal;

the channel lengths of the MOSFET transistors are the sane as one another; and the channel widths of the MOSFET transistors are set so as to limit or minimize or reduce to zero said net amount of charge injected.

B15. The semiconductor integrated circuitry [2+3] according to statement B14, wherein the channel width for the at least one MOSFET transistor of the Xth switch is the size of the channel width for the at least one MOSFET transistor of the X+1th switch, for each value of X from 1 to N−1.

B16. The semiconductor integrated circuitry [2+1 and 2+3+1] according to any of statements B3 to B15, wherein:

each said operating unit comprises first to Nth local regulation circuits;

for each value of X, the Xth reference regulation circuit comprises the Xth local regulation circuits;

for each value of X, each Xth local regulation circuit has an input terminal connected to receive a control signal from the Xth reference regulation circuit and is configured to regulate a reference signal at the Xth local reference node concerned based on the received control signal;

for each value of X, the input terminal of each Xth local regulation circuit has a high input impedance so that a relatively low amount of current is drawn from the Xth global reference node by that input terminal; and for each value of X, each Xth local regulation circuit is configured to draw a relatively high amount of current from a voltage supply and provide that current to the operating circuitry concerned at the Xth local reference node concerned.

B17. The semiconductor integrated circuitry [2+1 and 2+3+1] according to statement B16, wherein:

for each operating unit and for each value of X, the Xth local regulation circuit is configured to draw said relatively high amount of current from the voltage supply and provide that current to the operating circuitry concerned at the Xth local reference node so that a part of a current drawn by the operating circuitry from the Xth local reference node is provided from the voltage supply by the Xth local regulation circuit than from the Xth global reference node.

B18. The semiconductor integrated circuitry [2+1 and 2+3+1] according to statement B16 or B17, wherein, for each operating unit and for each value of X;

the Xth local regulation circuit comprises a transistor configured as a source-follower or emitter-follower transistor;

the input terminal of the Xth local regulation circuit is the gate or base terminal of that source-follower or emitter-follower transistor; and the Xth local regulation circuit is configured to provide said relatively high amount of current to the operating circuitry from the source or emitter terminal of that source-follower or emitter-follower transistor.

B19. The semiconductor integrated circuitry [2+4, 2+1+4 and 2+3+1+4] according to any of statements B3 to B18, wherein:

each distribution circuit is configured to connect the local reference nodes concerned of each of the operating units to the global reference node concerned via respective independent signal paths; and each signal path comprises a filter circuit connected therealong.

B20. The semiconductor integrated circuitry [2+4, 2+1+4 and 2+3+1+4] according to statement B19, wherein a local decoupling capacitor is connected at each or one or more of the local reference nodes.

B21. The semiconductor integrated circuitry [2+4, 2+1+4 and 2+3+1+4] according to statement B19 or B20, comprising a global decoupling capacitor connected to the global reference node.

B22. The semiconductor integrated circuitry [2+4, 2+1+4 and 2+3+1+4] according to any of statements B19 to B21, wherein each filter circuit is implemented as a resistance.

B23. The semiconductor integrated circuitry [2+4, 2+1+4 and 2+3+1+4] according to statement B22, wherein the resistance comprises one or more resistors connected together in parallel and/or in series.

B24. The semiconductor integrated circuitry [2+4, 2+1+4 and 2+3+1+4] according to statement B23, wherein each resistor is implemented as a MOSFET transistor configured to operate in its linear region.

B25. The semiconductor integrates circuitry [2+4, 2+1+4 and 2+3+1+4] according to any of statements B19 to B24, wherein the independent signal paths are:

electrically decoupled from each other over a given noise frequency bandwidth between the global reference node and the local reference nodes concerned; and/or electrically separated from each other between the global reference node and the local reference nodes concerned.

B26. The semiconductor integrated circuitry [any] according to any of statements B1 to B25, wherein:

each said operation generates a result dependent on a level of in the employed reference signal; and/or each said operation generates a result dependent on a data signal and the employed reference signal.

B27. The semiconductor integrated circuitry [any] according to any of statements B1 to B26, wherein:

said reference signals are voltage signals; and/or said reference signals have substantially the same magnitude as cure another.

B28. The semiconductor integrated circuitry [any] according to any of statements B1 to B27, wherein each said operation comprises one or more sub-operations.

B29. The semiconductor integrated circuitry [any] according to any of statements B1 to B28, wherein each said operating unit is a successive approximation ADC unit, and wherein each said operation comprises one or more comparison operations and/or wherein each said operating unit is configured to carry out non-binary conversion.

B30. The semiconductor integrated circuitry [any] according to any of statements B1 to B29, being an analogue-to-digital converter.

B31. An analogue-to-digital converter comprising the semiconductor integrated circuitry [any] according to any of statements B1 to B30.

C: Inv3 (T3)

C1. Semiconductor integrated circuitry [3], comprising:

an operating unit comprising operating circuitry, switching circuitry and first to Nth local reference nodes, where N is an integer and N≥2, the operating circuitry being operable to carry out a series of first to Nth operations each dependent on a corresponding reference signal;

reference regulation circuitry connected to provide first to Nth respective reference signals at the N local reference nodes; and control circuitry, wherein:

X is an integer variable ranging from 1 to N;

the control circuitry is configured, for the operating unit, to control its switching circuitry as the N operations are carried out to selectively connect its operating circuitry to its local reference nodes so that its operating circuitry employs the Xth reference signal provided at its Xth local reference node as the reference signal for its Xth operation; and the series of operations comprises carrying out the N operations in an order such that X increases from 1 to N;

the switching circuitry comprises first to Nth switches connecting a reference-signal-input node of the operating circuitry to the first to Nth local reference nodes, respectively;

for each value of X from 1 to N−1, the control circuitry is configured to turn on the Xth switch to provide the reference-signal-input node of the operating circuitry with the reference signal provided at the Xth local reference node for the Xth operation and then turn off the Xth switch and turn on the X+1th switch to provide the reference-signal-input node of the operating circuitry instead with the reference signal provided at the X+1th local reference node for the X+1th operation; and the switches are sized relative to one another so as to limit or minimize or reduce to zero a net amount of charge injected into the reference-signal-input node of the operating circuitry from the reference nodes when the Xth switch is turned off and the X+1th switch is turned on, for each value of X from 1 to N−1.

C2. The semiconductor integrated circuitry [3] according to statement C1, wherein:

the switches are each implemented using at least one MOSFET transistor; and the channel widths and lengths of the MOSFET transistors are set so as to limit or minimize or reduce to zero said net amount of charge injected.

C3. The semiconductor integrated circuitry [3] according to statement C2, wherein:

the reference signals provided at the local reference nodes have substantially the same voltage level as one another;

switching signals provided at the gate terminals of the MOSFET transistors to turn the Xth switch off and the X+1th switch on switch between high and low voltage levels which have the same potential difference between one another, for each value of X from 1 to N−1;

the switches have the same number and arrangement of MOSFET transistors as one another; and the channel widths and lengths of the MOSFET transistors are set so that the gate capacitance Cgs for the at least one MOSFET transistor of the Xth switch is equal to the sum of the gate capacitances Cgs and Cgd for the at least one MOSFET transistor of the X+1th switch, for each value of X from 1 to N−1.

C4. The semiconductor integrated circuitry [3] according to statement C3, wherein:

the gate capacitances Cgs and Cgd for each of the MOSFET transistors are equal;

the channel length of the MOSFET transistors are the same as one another; and the channel widths of the MOSFET transistors are set so as to limit or minimize or reduce to zero said net amount of charge injected.

C5. The semiconductor integrated circuitry [3] according to statement C4, wherein the channel width for the at least one MOSFET transistor of the Xth switch is twice the size of the channel width for the at least one MOSFET transistor of the X+1th switch, for each value of X from 1 to N−1.

C6. The semiconductor integrated circuitry [3] according to any of statements C1 to C5, wherein N equals 2 or 3 or 4.

C7. The semiconductor integrated circuitry [any] according to any of statements C1 to C6, wherein:

each said operation generates a result dependent on a level of nose in the employed reference signal; and/or each said operation generates a result dependent on a data signal and the employed reference signal.

C8. The semiconductor integrated circuitry [any], ding to any of statements C1 to C7, wherein;

said reference signals are voltage signals: and/or said reference signals have substantially the same magnitude as one another.

C9. The semiconductor integrated circuitry [any] according to any of statements C1 to C8, wherein each said operation comprises one or more sub-operations.

C10. The semiconductor integrated circuitry [any] according to any of statements C1 to C9, wherein each said operating unit is a successive approximation ADC unit, and wherein each said operation comprises one or more comparison operations and/or wherein each said operating unit is configured to carry out non-binary conversion.

C11. The semiconductor integrated circuitry [any] according to any of statements C1 to C10, being an analogue-to-digital converter.

C12. An analogue-to-digital converter comprising the semiconductor integrated circuitry [any] according to any of statements C1 to C11.

D: Inv4 (T4)

D1. Semiconductor integrated circuitry [4], comprising:

a plurality of operating units each comprising a local reference node and operating circuitry, and each operating unit being operable to carry out an operation dependent on a reference signal provided at its local reference node;

a global reference node; and a distribution circuit via which the local reference nodes of each of the operating units e connected to the global reference node, wherein:

the distribution circuit is configured to connect the local reference nodes of each of the operating units to the global reference node via respective independent signal paths; and each signal path comprises a filter circuit connected therealong.

D2. The semiconductor integrated circuitry [4] according to statement D1, wherein a local decoupling capacitor is connected at each or one or more of the local reference nodes.

D3. The semiconductor integrated circuitry [4] according to statement D1 or D2, comprising a global decoupling capacitor connected to the global reference node.

D4. The semiconductor integrated circuitry [4] according to any of statements D1 to D3, wherein each filter circuit is implemented as a resistance.

D5. The semiconductor integrated circuitry [4] according to statement D4, wherein the resistance comprises one or more resistors connected together in parallel and/or in series.

D6. The semiconductor integrated circuitry [4] according to statement D5, wherein each resistor is implemented as a MOSFET transistor configured to operate in its linear region.

D7. The semiconductor integrated circuitry [4] according to any of statements D1 to D5, wherein the independent signal paths are:

electrically decoupled from each other over a given noise frequency bandwidth between the global reference node and the local reference nodes; and/or electrically separated from each other between the global reference node and the local reference nodes.

D8. The semiconductor integrated circuitry [4] according to any of statements D1 to D7, comprising a reference regulation circuit configured to regulate the respective reference signals provided at the local reference nodes and/or a reference signal provided at the global reference node.

D9. The semiconductor integrated circuitry [any] according to any of statements D1 to D8, wherein:

each said operation generates u dependent on a level of noise in the employed reference signal; and/or each said operation generates a result dependent on a data signal and the employed reference signal.

D10. The semiconductor integrated circuitry [any] according to any of statements D1 to D9, wherein:

said reference signals are voltage signals; and/or said reference signal have substantially the same magnitude as one another.

D11. The semiconductor integrated circuitry [any] according any of statements D1 to D10, wherein each said operation comprises one or more sub-operations.

D12. The semiconductor integrated circuitry [any] according to any of statements D1 to D11, wherein each said operating unit is a successive approximation ADC unit, and wherein each said operation comprises one or more comparison operations and/or wherein each said operating unit is configured to carry out non-binary conversion.

D13. The semiconductor integrated circuitry [any] according to any of statements D1 to D12, being an analogue-to-digital converter.

D14. An analogue-to-digital converter comprising the se semiconductor integrated circuitry [any] according to any of statements D1 to D13.

The invention claimed is:

1. Semiconductor integrated circuitry, comprising:
a global reference node;
a distribution circuit;
a plurality of operating units each comprising a local regulation circuit, a local reference node and operating circuitry, and each operating unit being operable to carry out an operation dependent on a reference signal provided at its local reference node; and reference regulation circuitry which comprises the local regulation circuits and is connected to provide respective reference signals at the local reference nodes, the reference regulation circuitry generating a control signal, wherein, for each of the operating units, the local regulation circuit has an input terminal connected to receive the control signal from the reference regulation circuitry and is configured to regulate a voltage level of a reference signal at the local reference node based on the received control signal;

the input terminal of the local regulation circuit has a high input impedance so that a relatively low amount of current is drawn from the reference regulation circuitry by the input terminal; and the local regulation circuit is configured to draw a relatively high amount of current from a voltage supply and provide that current to the operating circuitry concerned at the local reference node, and wherein:

the distribution circuit comprises signal paths which connect the local reference nodes of the operating circuits to the global reference node to enable current drawn at the local reference nodes by the operating circuitry of the operating units to be drawn from the global reference node; and for each operating unit, the local regulation circuit is configured to draw said relatively high amount of current from the voltage supply and provide that current to the operating circuitry concerned at the local reference node so that a part of a current drawn by the operating circuitry from the local reference node is provided from the voltage supply by the local regulation circuit rather than from the global reference node.

2. The semiconductor integrated circuitry according to claim 1, wherein, for each operating unit:

the local regulation circuit comprises a transistor configured as a source-follower or emitter-follower transistor;

the input terminal of the local regulation circuit is the gate or base terminal of the source-follower or emitter-follower transistor; and the local regulation circuit is configured to provide said relatively high amount of current to the operating circuitry from the source or emitter terminal of the source-follower or emitter-follower transistor.

3. The semiconductor integrated circuitry according to claim 1, wherein:

each operating unit comprises first to Nth said local regulation circuits and first to Nth said local reference nodes, where N is an integer and N≥2;

each operating unit comprises switching circuitry;

for each operating unit, the operating circuitry is operable to carry out a series of first to Nth operations each dependent on a corresponding reference signal, each of the N operations having a corresponding noise tolerance level of first to Nth noise tolerance levels, those N noise tolerance levels being different from one another;

the reference regulation circuitry comprises the N local regulation circuits of each of the operating units and is connected, for each operating unit, to provide first to Nth respective separate reference signals at its N local reference nodes;

the semiconductor integrated circuitry comprises control circuitry;

X is an integer variable ranging from 1 to N;

the control circuitry is configured, for the operating unit, to control its switching circuitry as the N operations are carried out to selectively connect its operating circuitry to its local reference nodes so that its operating circuitry employs the Xth reference signal provided at its Xth local reference node as the reference signal for its Xth operation; and each noise tolerance level is a level of noise in the employed reference signal which the operation concerned can tolerate.

4. The semiconductor integrated circuitry according to claim 3, comprising:

first to Nth said global reference nodes; and first to Nth said distribution circuits, wherein:

for each value of X, the Xth local reference nodes of the operating circuits are connected to the Xth global reference node via the Xth distribution circuit.

5. The semiconductor integrated circuitry according to claim 4, wherein:

the reference regulation circuitry comprises first to Nth reference regulation circuits;

the first to Nth reference regulation circuits comprise first to Nth global regulation circuits;

for each value of X, the Xth reference regulation circuit comprises the Xth local regulation circuits of the operating units; and for each value of X, the Xth reference regulation circuit is configured to regulate the respective reference signals provided at the Xth local reference nodes and a reference signal provided at the Xth global reference node.

6. The semiconductor integrated circuitry according to claim 5, wherein:

the N reference regulation circuits are configured to regulate their reference signals independently of one another; or the N distribution circuits each connect their local reference nodes to their global reference node via respective filter circuits, the filter circuits of each said distribution circuit are different from the filter circuits of each other said distribution circuit, and the N reference regulation circuits share a common regulator so that they regulate the reference signals at their global reference nodes in a single regulation operation.

7. The semiconductor integrated circuitry according to claim 3, wherein the operating units are configured to carry out their respective series of operations in a time-interleaved manner so that different operating units are at different stages in their respective series of N operations at the same time.

8. The semiconductor integrated circuitry according to claim 3, wherein the Xth noise tolerance level is lower than the X−1th noise tolerance level for each value of X from 2 to N.

9. The semiconductor integrated circuitry according to claim 3, wherein each of the N operations has a corresponding noise injection level of first to Nth noise injection levels, those N noise injection levels being different from one another, wherein each noise injection level is a level of noise which the operation concerned injects into the employed reference signal at the local reference node concerned, optionally wherein the Xth noise injection level is lower than the X−1th noise injection level for each value of X from 2 to N.

10. The semiconductor integrated circuitry according to claim 3, wherein, for each operating unit:

the series of operations comprises carrying out the N operations in an order such that X increases from 1 to N;

the switching circuitry comprises first to Nth switches connecting a reference-signal-input node of the operating circuitry to the first to Nth local reference nodes, respectively;

for each value of X from 1 to N−1, the control circuitry is configured to turn on the Xth switch to provide the reference-signal-input node of the operating circuitry with the reference signal provided at the Xth local reference node for the Xth operation and then turn off the Xth switch and turn on the X+1th switch to provide the reference-signal-input node of the operating circuitry instead with the reference signal provided at the X+1th local reference node for the X+1th operation; and the switches are sized relative to one another so as to limit or minimize or reduce to zero a net amount of charge injected into the reference-signal-input node of the operating circuitry from the reference nodes when the Xth switch is turned off and the X+1th switch is turned on, for each value of X from 1 to N−1.

11. The semiconductor integrated circuitry according to claim 1, wherein:

each distribution circuit is configured to connect the local reference nodes concerned of each of the operating units to the global reference node concerned via respective independent signal paths; and each signal path comprises a filter circuit connected therealong.

12. The semiconductor integrated circuitry according to claim 1, wherein:

a local decoupling capacitor is connected at each or one or more of the local reference nodes; or a global decoupling capacitor is connected to each global reference node.

13. Semiconductor integrated circuitry, comprising:

an operating unit comprising operating circuitry, a reference-signal-input node, switching circuitry and first to Nth local reference nodes, where N is an integer and N≥2, the operating circuitry being operable to carry out a series of first to Nth operations each dependent on a corresponding reference signal, each of the N operations having a corresponding noise tolerance level of first to Nth noise tolerance levels, those N noise tolerance levels being different from one another;

reference regulation circuitry connected to provide first to Nth respective separate reference signals at the N local reference nodes; and control circuitry, wherein:

X is an integer variable ranging from 1 to N;

the control circuitry is configured, for the operating unit, to control its switching circuitry as the N operations are carried out to selectively connect the reference-signal-input node of its operating circuitry to its local reference nodes one-by-one so that its operating circuitry employs the Xth reference signal provided at its reference-signal-input node from its Xth local reference node as the reference signal for its Xth operation; and each noise tolerance level is a level of noise in the employed reference signal which the operation concerned can tolerate.

14. Semiconductor integrated circuitry, comprising:

an operating unit comprising operating circuitry, switching circuitry and first to Nth local reference nodes, where N is an integer and N≥2, the operating circuitry being operable to carry out a series of first to Nth operations each dependent on a corresponding reference signal;

reference regulation circuitry connected to provide first to Nth respective reference signals at the N local reference nodes; and control circuitry, wherein:

X is an integer variable ranging from 1 to N;

the control circuitry is configured, for the operating unit, to control its switching circuitry as the N operations are carried out to selectively connect its operating circuitry to its local reference nodes so that its operating circuitry employs the Xth reference signal provided at its Xth local reference node as the reference signal for its Xth operation; and the series of operations comprises carrying out the N operations in an order such that X increases from 1 to N;

the switching circuitry comprises first to Nth switches connecting a reference-signal-input node of the operating circuitry to the first to Nth local reference nodes, respectively;

for each value of X from 1 to N−1, the control circuitry is configured to turn on the Xth switch to provide the reference-signal-input node of the operating circuitry with the reference signal provided at the Xth local reference node for the Xth operation and then turn off the Xth switch and turn on the X+1th switch to provide the reference-signal-input node of the operating circuitry instead with the reference signal provided at the X+1th local reference node for the X+1th operation; and the switches are sized relative to one another so as to limit or minimize or reduce to zero a net amount of charge injected into the reference-signal-input node of the operating circuitry from the reference nodes when the Xth switch is turned off and the X+1th switch is turned on, for each value of X from 1 to N−1.

15. Semiconductor integrated circuitry, comprising:

a plurality of operating units each comprising a local reference node and operating circuitry, and each operating unit being operable to carry out an operation dependent on a reference signal provided at its local reference node;

a global reference node; and a distribution circuit via which the local reference nodes of each of the operating units are connected to the global reference node, wherein:

the distribution circuit is configured to connect the local reference nodes of each of the operating units to the global reference node via respective independent signal paths; and each signal path comprises a filter circuit connected therealong, wherein:

a local decoupling capacitor is connected at each or one or more of the local reference nodes;

a global decoupling capacitor connected to the global reference node; and the semiconductor integrated circuitry comprises a reference regulation circuit configured to regulate the respective reference signals provided at the local reference nodes or a reference signal provided at the global reference node.

16. The semiconductor integrated circuitry according to claim 1, wherein the reference regulation circuitry is configured, based on the control signal, to regulate a voltage level of a reference signal at the global reference node.

* * * * *